United States Patent [19]

Sakaue et al.

[11] Patent Number: 5,524,230

[45] Date of Patent: Jun. 4, 1996

[54] EXTERNAL INFORMATION STORAGE SYSTEM WITH A SEMICONDUCTOR MEMORY

[75] Inventors: Yoshinori Sakaue; Hideto Niijima, both of Tokyo, Japan

[73] Assignee: International Business Machines Incorporated, Armonk, N.Y.

[21] Appl. No.: 410,589

[22] Filed: Mar. 27, 1995

Related U.S. Application Data

[63] Continuation of Ser. No. 876,245, Apr. 30, 1992, abandoned.

[30] Foreign Application Priority Data

Dec. 7, 1991 [JP] Japan ................................ 3-197318

[51] Int. Cl.[6] .......................... G06F 12/00; G06F 12/10
[52] U.S. Cl. ................ 395/430; 364/966.4; 364/965.76; 364/DIG. 1; 364/DIG. 2
[58] Field of Search ..................................... 395/400, 425; 364/966.4, 965.76, 200 MS File, 900 MS File

[56] References Cited

U.S. PATENT DOCUMENTS

| 4,511,964 | 4/1985 | Georg et al. ............................. 395/400 |
| 4,718,038 | 1/1988 | Yoshida .................................... 395/425 |
| 5,210,716 | 5/1993 | Takada ..................................... 365/200 |
| 5,218,691 | 6/1993 | Tuma et al. .............................. 395/500 |
| 5,224,070 | 6/1993 | Fandrich et al. ........................ 365/185 |
| 5,226,168 | 7/1993 | Kobayishi et al. ..................... 395/800 |
| 5,263,003 | 11/1993 | Cowles et al. ...................... 365/230.03 |
| 5,268,870 | 12/1993 | Harari .................................... 365/218 |
| 5,291,584 | 3/1994 | Challa et al. ........................... 395/500 |
| 5,297,148 | 3/1994 | Harari et al. .......................... 371/10.2 |

*Primary Examiner*—Eddie P. Chan
*Assistant Examiner*—Frank J. Asta
*Attorney, Agent, or Firm*—Michael J. Buchenhorner

[57] ABSTRACT

To provide an external storage system using a semiconductor memory in which the data reading and writing between the host CPU can be processed faster than the conventional magnetic disk, and only a particular sector is not frequently written and erased so that the whole memory is effectively used over a long period of time. An address control scheme was introduced in which flexibility is given to the address relation between the host CPU and the external storage and the physical address of the semiconductor memory is not one-sidely determined by the logical address possessed by the command of the host CPU. Command processing section 34 always prepares memory blocks and sectors for writing or erasing and copying in preparation for the command processing of the host CPU, and records and holds the correspondence relation between the physical address of the selected memory block 32*i* or sector and the command of the host CPU in address conversion table 36. The status of memory blocks and sectors is recorded in respective managing tables 35 and 60, and used for control of processings such as writing, erasing and copying in preparation for or in response to the command of the host CPU.

17 Claims, 30 Drawing Sheets

| 35 | 72 | 74 |
|---|---|---|
| i | NUMBER OF EMPTY SECTORS | NUMBER OF VALID SECTORS |
| 0 | B(0,1) | B(0,2) |
| 1 | B(1,1) | B(1,2) |
| 2 | B(2,1) | B(2,2) |
| ⋮ | ⋮ | ⋮ |
| N-1 | B(N-1,1) | B(N-1,2) |
| | B( ,1) 76 | |

FIG. 6

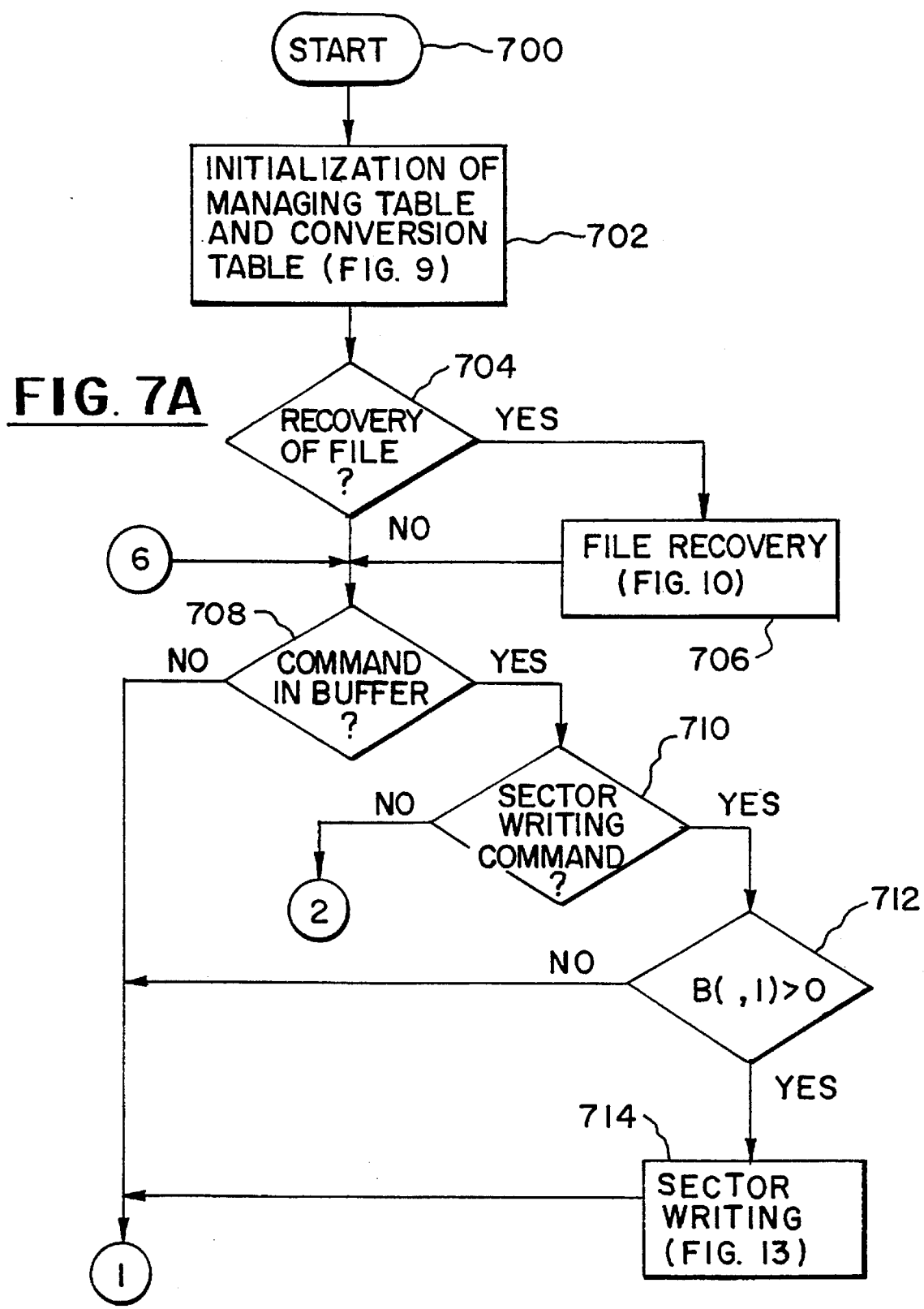

EXTERNAL INFORMATION STORAGE SYSTEM WITH A SEMICONDUCTOR MEMORY

This is a continuation of application Ser. No. 07/876,245 filed Apr. 30, 1992 now abandoned.

BACKGROUND OF THE INVENTION

1. Technical Field

The present invention relates to a semiconductor memory using an electrically erasable nonvolatile memory which is called a flash EEPROM or flash memory. In particular, to a semiconductor external storage system which can replace the magnetic disk in a conventional computer system.

2. Background Art

As portable personal computers such as those commonly knows as notebook computers have spread, the requirement for small-sized, lightweight and low power consumption computer systems has become increasing strong. The external storage system using a semiconductor memory has a low power consumption and can operate at a high speed because it does not use a mechanical drive system such as the magnetic disk, in addition, it consists of small memory modules, and thus it is small-sized, lightweight, and has a large degree of freedom with respect to shape as compared with the magnetic disk, and is also easily made in the form of a card.

However, the conventional semiconductor memory has many problems with respect to such points as capacity and battery backup. If SRAM is used as the memory, the cost is high and the capacity becomes small though the backup time by a battery becomes long. For DRAM which is excellent in cost and capacity, the standby power consumption is large and the backup time is limited to one week or so. There is also a danger of data loss due to a problem in the battery system. EEPROM is costly though it requires no battery.

A block erase type flash memory has been developed as a memory to solve these problems. Its memory element consists of one transistor as DRAM, and it can be provided with high density and it is expected to have a bit cost equivalent to or less than DRAM (low cost, large capacity) depending on the future market. The memory element is nonvolatile and requires no battery backup. The outline of such flash memory is introduced by Richard D. Pashley et al. in "Flash memories: the best of two worlds", IEEE SPECTRUM, December 1989, pp. 30–33. Also, a similar flash memory is disclosed in Published Unexamined Patent Application No. 2-10598.

However, the flash memory has limitations which SRAM and DRAM do not have. First, the erase/program cycles have an upper limit of the order of 100,000. In addition, the programming of memory bits is a one-way process and change is allowed only from 0 to 1 or 1 to 0. For change in the opposite direction, it is necessary to set the whole memory block to 0 or 1 by block erasure. Erasing usually takes several tens of milliseconds, and block erasure requires special procedures such as verify which takes a further several seconds.

If a semiconductor memory consisting of such flash memory is connected to the bus of a host computer as an alternate to the traditional magnetic disk, a specific sector is very often written by the host computer and reaches the upper limit of the erase/program cycles considerably earlier than other sectors. Further, the sector writing takes a lot of time. The reason for this is that, to modify several bytes in the sector, all the data within the memory block including the sector are temporarily saved in the memory space of the host computer, and new data is written back to empty sectors after erasing of the memory block. It takes several seconds to write a sector in a semiconductor memory having a capacity of 1M bits or more. In addition, a special program is required to connect a semiconductor memory to the bus of the host computer.

To solve these problems, the development of a sector erase type flash memory is needed. For instance, 27F010 from SEEQ TECHNOLOGY CORPORATION (1024 K flash EPROM) allows not only the chip erasure which erases all the bits of the memory chip (change to logical one) but also the sector erasure which erases only a specific sector. In this scheme, the saving or writing back of sectors other than those to be erased can be avoided. However, it takes on the order of several tens of milliseconds because the erasing of old sectors is done along with the writing of sectors, and thus the obtained performance is equivalent to or less than the magnetic disk. In addition, the problem is not solved that a particular sector is written very often by the host computer and reaches the allowed erase/program cycles somewhat earlier than other sectors, and thus the sectors cannot effectively be used as the whole flash memory. Further, the sector erase type has a chip structure which is more complicated than the block erase type, and it is said that there are also problems with respect to cost and erase/program cycles.

Incidentally, many of these problems are considered to be due to the control scheme in which the block and sector adresses of the external storage are controlled by the host computer, that is, the physical address of the external storage is determined by the logical address possessed by the command of the host computer.

SUMMARY OF THE INVENTION

It is an object of the present invention to provide an external storage system using a semiconductor memory which can process the data reading and writing between the host computer at a speed higher than the conventional magnetic disk.

It is another object of the present invention to provide a semiconductor external storage system in which the whole semiconductor memory is effectively used for a long period of time without frequently writing and erasing only a particular sector in the semiconductor memory.

It is still another object of the present invention to provide a semiconductor external storage system which is compatible with a conventional magnetic disk when it is connected to a computer system.

It is yet another object of the present invention to provide a semiconductor external storage system in which files can easily be restored even if the power is disconnected in a writing.

These objects can be solved by providing flexibility in the address relation between the host computer and the external storage, and by introducing an address control scheme in which the physical address of the external storage is not one-sidedly decided on by the logical address possessed by the command of the host computer. On the external storage side, a memory block or sector for writing or copying is always prepared for the command processing of the host, and the correspondence relationship of the physical address of the selected memory block or sector with the command of the host computer is recorded and held in an address conversion table. The status of the memory block and sector is recorded and managed in the respective managing tables.

On the external storage side, an optimum memory block or sector can be selected in consideration of the processing speed of the host computer and the utilization efficiency of the semiconductor memory. In addition, the processing speed of the host computer can be increased without waiting for the command of the host, or executing the command processing in parallel with the command of the host. That is, memory blocks in which data can be written or erased are prepared beforehand on the basis of the record in the block managing means, thereby occasioning a fast processing in response to the command of the host processor. Moreover, since the memory blocks and sectors of the semiconductor memory can be totally managed and the physical address can freely be selected in consideration of the utilization efficiency, the unnecessary frequent erasure of a particular memory block in the semiconductor memory is eliminated and the whole memory is effectively used over a long period of time. Since the host computer can give a command to the external storage without considering the physical address and receive the result of the process, compatibility with the traditional magnetic disk can be maintained. Also, no rewriting of data directly connected with the command address of the host processor is performed, and thus files can easily be recovered.

BRIEF DESCRIPTION OF THE DRAWINGS

FIG. 6 is a representation showing an example of the construction of the block managing table.

FIG. 7A is a flowchart showing the normal processing of the command processing section.

DESCRIPTION OF THE PREFERRED EMBODIMENT

In accordance with the more particular features of the present invention, the semiconductor external storage system comprises a semiconductor memory consisting of a flash memory and comprised of a plurality of memory blocks each including at least one sector, an address conversion table, block managing means, and a command processing section;

the address conversion table is used to record the correspondence relationship of the physical address of a sector or memory block with the command of the host processor, and the block managing means records the number of times each memory block was erased and the status of each memory block and sector;

the command processing section selects a memory block in which data writing or erasing is performed on the basis of the record of the block managing means, executes a process of data writing, reading or erasing to the memory block or sector that has the physical address obtained from the address conversion table in response to the command, sequentially records and updates the status change of each sector or memory block in the block managing means, records and updates the correspondence relationship of the physical address of the sector or memory block with the logical address from the host processor in the address comparison table, and selects a memory block in which a data writing or erasing is to be executed next on the basis of the record of the block managing means.

Figure 1:
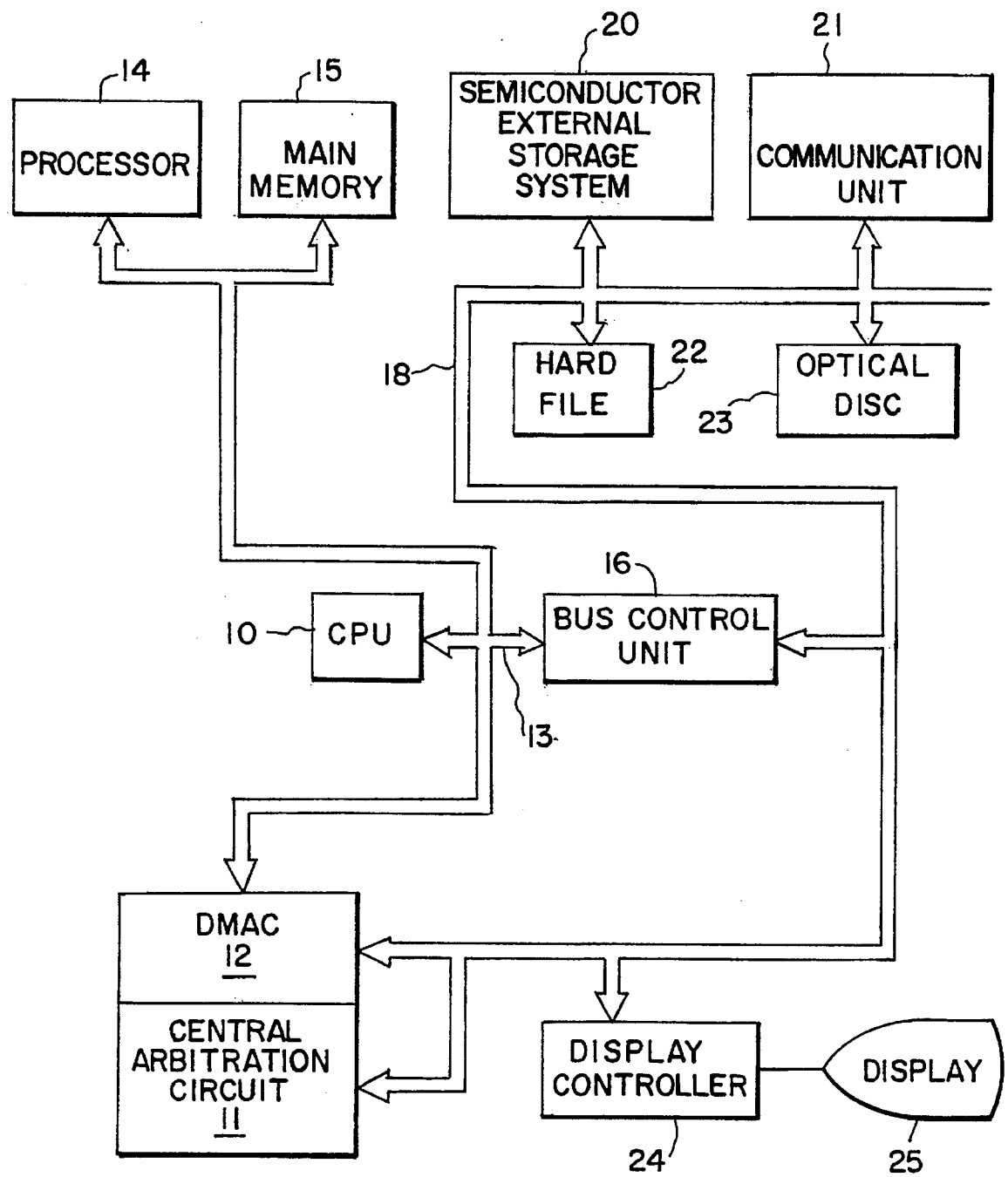
FIG. 1 is a representation showing an example of the computer system in which the semiconductor external storage system of the present invention is incorporated.

FIG. 1 shows an example of the computer system in which the semiconductor external storage system of the present invention is incorporated. CPU 10 communicates via system bus 13 with main memory 15, bus control unit 16 and coprocessor 14 for arithmetic operations which is optional. The communications between CPU 10 and its associated peripheral devices are done via bus control unit 16. For this, bus control unit 16 is connected to the peripheral devices via family bus 18. The external storage system 20 made of a flash memory and, in an embodiment of the present invention is connected, to the family bus 18. The communication device 21, hard file 22 and optical disk 23 are also connected to family bus 18. Block 24 is a display controller and block 25 is a CRT. Of course other peripheral devices can be connected to the computer system. Such a computer system can be built from, for instance, an IBM PS/2 personal computer.

Direct memory access control unit (DMAC) 12 is provided to enable memory accesses by all or selected peripheral devices. For this, at least part of family bus 18 is multipoint-connected to DMAC 12. Although not shown in the FIG. 1, an arbitration circuit is provided in each peripheral device to which the DMA access is allowed, and assigned an arbitration level (priority). On the DMCA 12 side, central arbitration control circuit 11 is provided which performs arbitration work between a plurality of peripheral devices demanding a DMA access at the same time and notifies DMAC 12 of which peripheral device has been allowed a DMA access. For details of the DMA control by DMAC 12 and central arbitration control circuit 11, refer to the U.S. Pat. No. 4,901,234.

Figure 2:
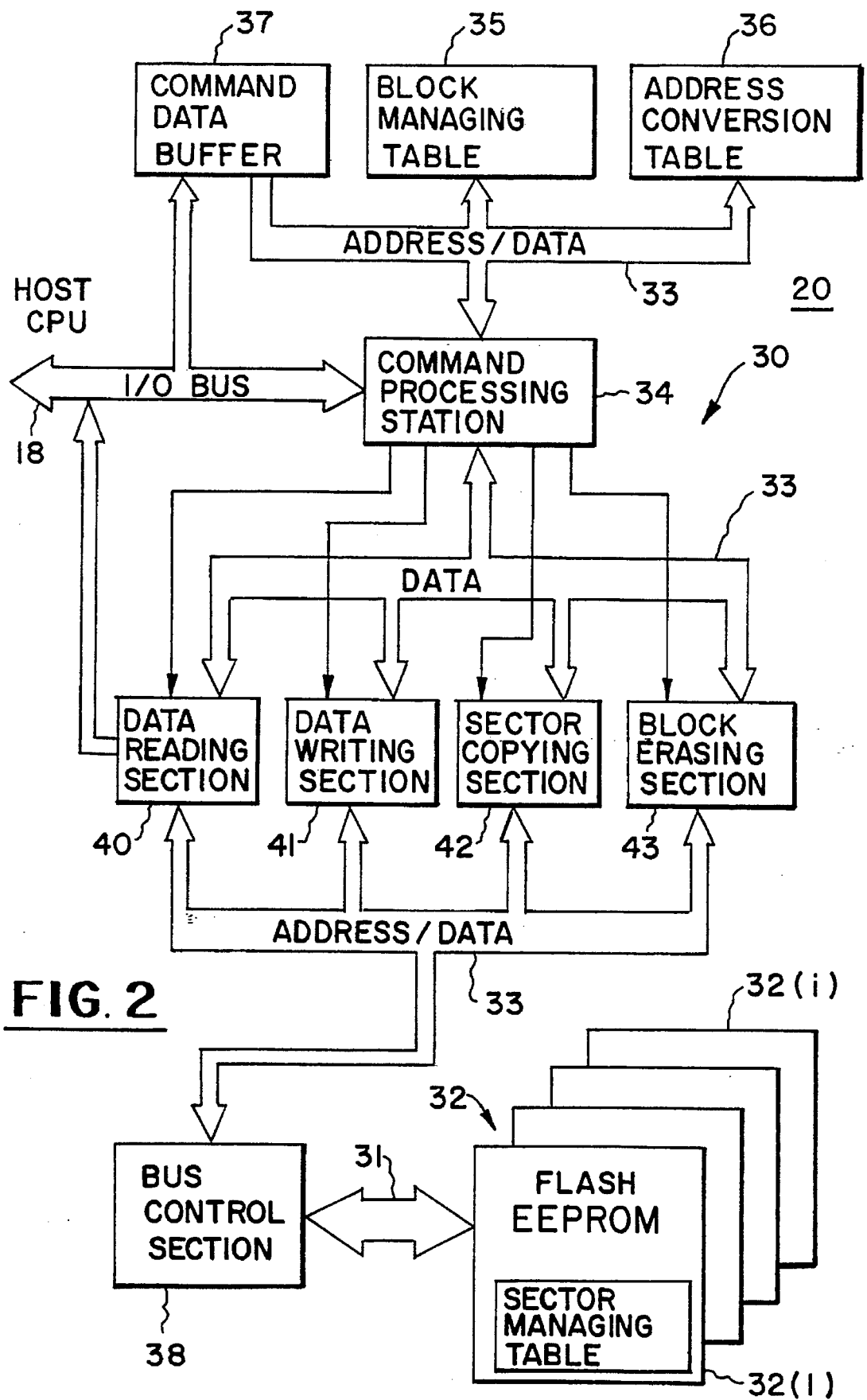
FIG. 2 is a representation showing the detail of the functions of an embodiment of the semiconductor external storage system of the present invention.

FIG. 2 shows details of the functional structure of semiconductor external storage system 20. This semiconductor external storage system includes control unit 30 connected to family bus 18, and flash memory 32 that is connected to semiconductor memory bus 31. Control unit 30 includes command processing section 34, block managing table 35, address conversion table 36 and buffer 37 which are interconnected by control unit bus 33. Flash memory 32 consists of a plurality of memory blocks 32 (32(1)–32(i)) containing a plurality of sectors. In this embodiment, as memory block 32, a flash memory chip is assumed which allows only a change from 1 to 0 and is all set to one by block erasure, but a chip can be used which is opposite to those. Command processing section 34 includes an arbitration circuit and performs a DMA transfer and I/O control. Address conversion table 36 is used to convert the logical address sent from CPU 10 through family bus 18 to the physical address of flash memory 32, and consists of a random access memory. This random access memory can include buffer 37.

Bus control section 38 has a well-known receiver/driver used for interconnecting semiconductor memory bus 31 and control unit bus 33. Although bus control section 38 is constructed so as to accomplish parallel transfer of 16 bits between buses 31 and 33 in this embodiment, the present invention of course is not limited to such parallel transfer. Command processing section 34 manages data reading section 40, data writing section 41, sector copying 42 and block erasing section 43. Flash memory 32 is managed as a collection of sectors. In this embodiment, individual memory blocks 32(1)–32(i) constituting flash memory 32 consists of 512 sectors, and each sector includes 512 bytes. The numbers of sectors and bytes may be changed depending on the storage capacity of memory block 32 and the architecture.

Incidentally, in the present invention, the memory block comprises a region on the memory chip which can be collectively erased by a block erasing section. Although one memory block corresponds to one memory chip in this embodiment, a plurality of memory blocks may exist in one memory chip, and one sector may correspond to one memory block as in the example of the sector erase type described later.

Figure 3:
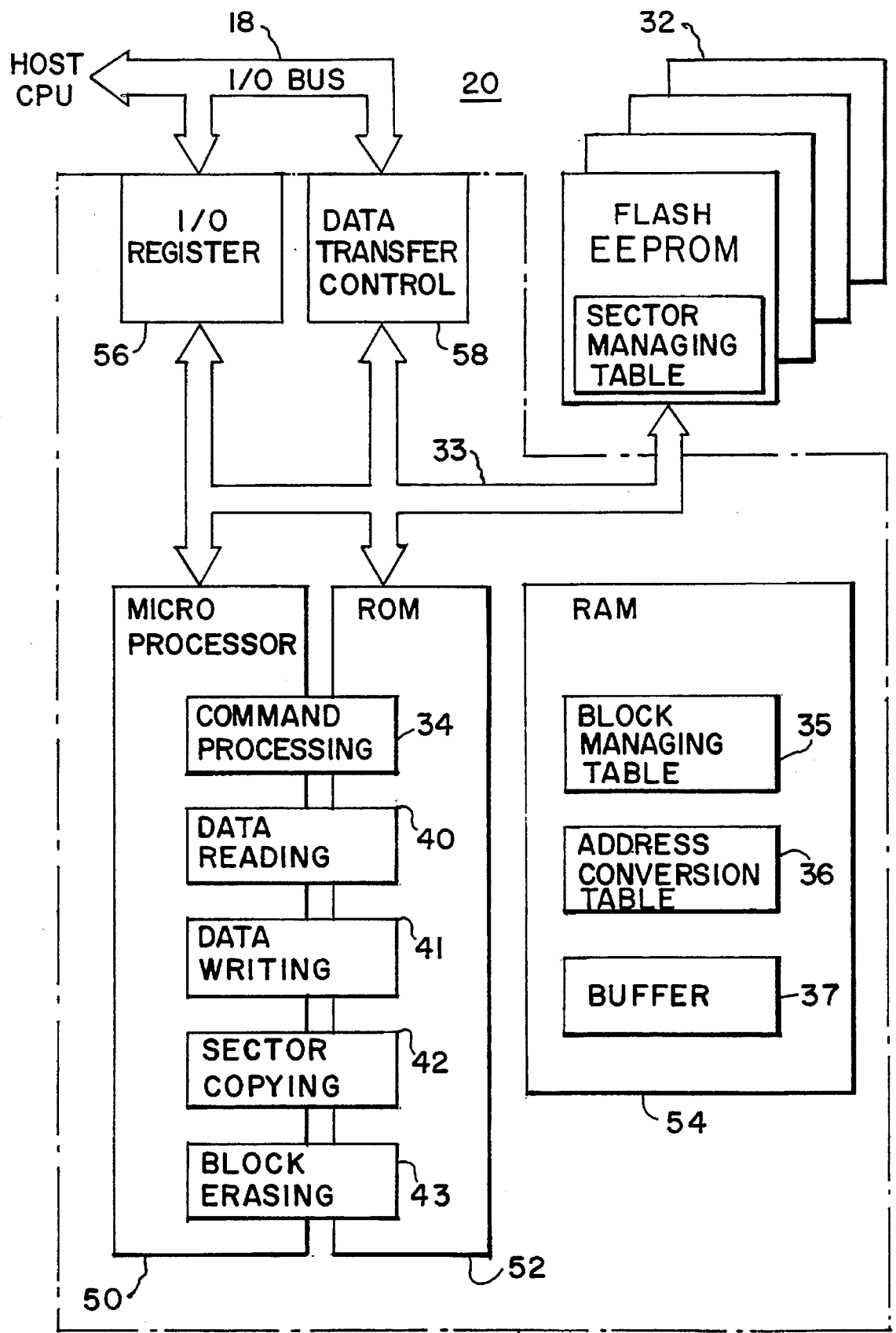
FIG. 3 is a representation showing the details of the construction used for implementing the functions of the semiconductor external storage system of FIG. 2.

FIG. 3 shows the hardware arrangement of semiconductor external storage system 20 of FIG. 2. In the figure, the respective functional portions of command processing section 34, data reading section 40, data writing section 41, copying section 42 and erasing section 43 are built with a microprocessor 50. The micro code controlling the microprocessor 50 is stored in ROM 52. Since block managing table 35 and address conversion table 36 are often modified and very fast access is required, they are formed on RAM 54. Microprocessor 50 communicates with the host CPU 10 via I/O register 56 at any time. Data transfer control unit 58 connects I/O bus 18 and local bus 33 as needed, thereby enabling data transfer between buffer 37 and flash memory (EEPROM) 32. Except for data transfer, these buses are disconnected and microprocessor 50 can function independently of host CPU 10.

Figure 4:
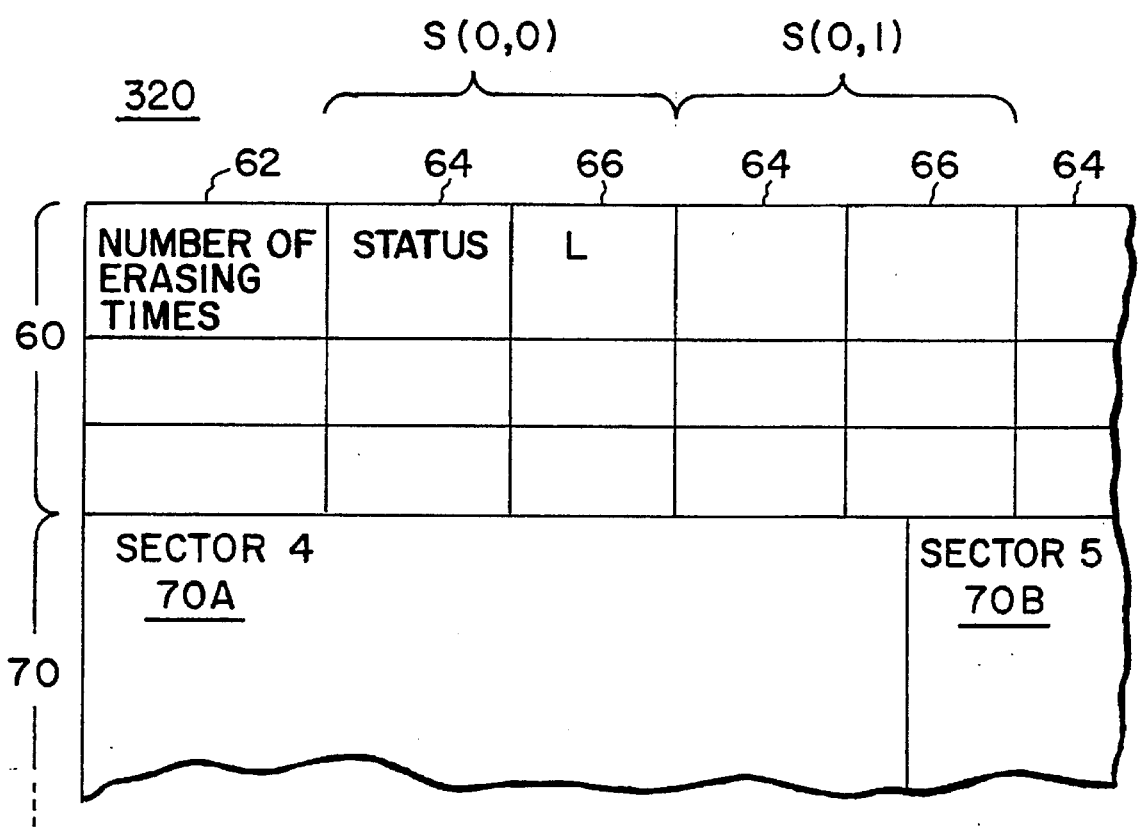
FIG. 4 is a representation showing an example of the sector construction of a memory.

As shown in FIG. 4, the first several sectors of each memory block 320 are used as sector managing table 60, in which the status 64 and logical address L 66 of each sector are stored. The remaining sectors of each memory block 320 are used as data region 70 (70A–70N). The size of sector managing table 60 depends on the memory block and the capacity of the sectors included therein, and in the above described example of 512 sectors per block and 512 bytes per sector, four sectors are required as the sector managing table. To each sector 70A–70N, a logical address is assigned as described later. These sectors including sector managing table 60 are formatted on a memory chip using a format program.

Sector managing table 60 includes a plurality of entries each of four bytes, and in the first entry thereof, the number of times 62 the related memory block 40 was erased is stored. In the second entry, status 64 and logical address 66 of the first sector (in this case, sector 4) used as data region 70A in the related memory block are stored. In the third entry, status 64 and logical address 66 of the next sector 70B or sector 5 are stored, and similarly, the status and logical addresses of the subsequent respective sectors are sequentially stored.

Status 64 of a sector is indicated by a 4-bit status flag as described below. Since the status flag is on the flash memory, the bit change is limited in one direction.

1111=blank

1110=valid

1100=invalid

0000=under erasure

The status for each memory block is recorded in block managing table 35 on the basis of status 64 in sector managing table 60. FIG. 6 shows an example of block managing table 35, in which the number of blank sectors B (i, 1) 72 and the number of valid sectors B (i, 2) 74 per memory block i, and the number of blank sectors B (, 1) 76 of the whole memory block are recorded.

Figure 5:
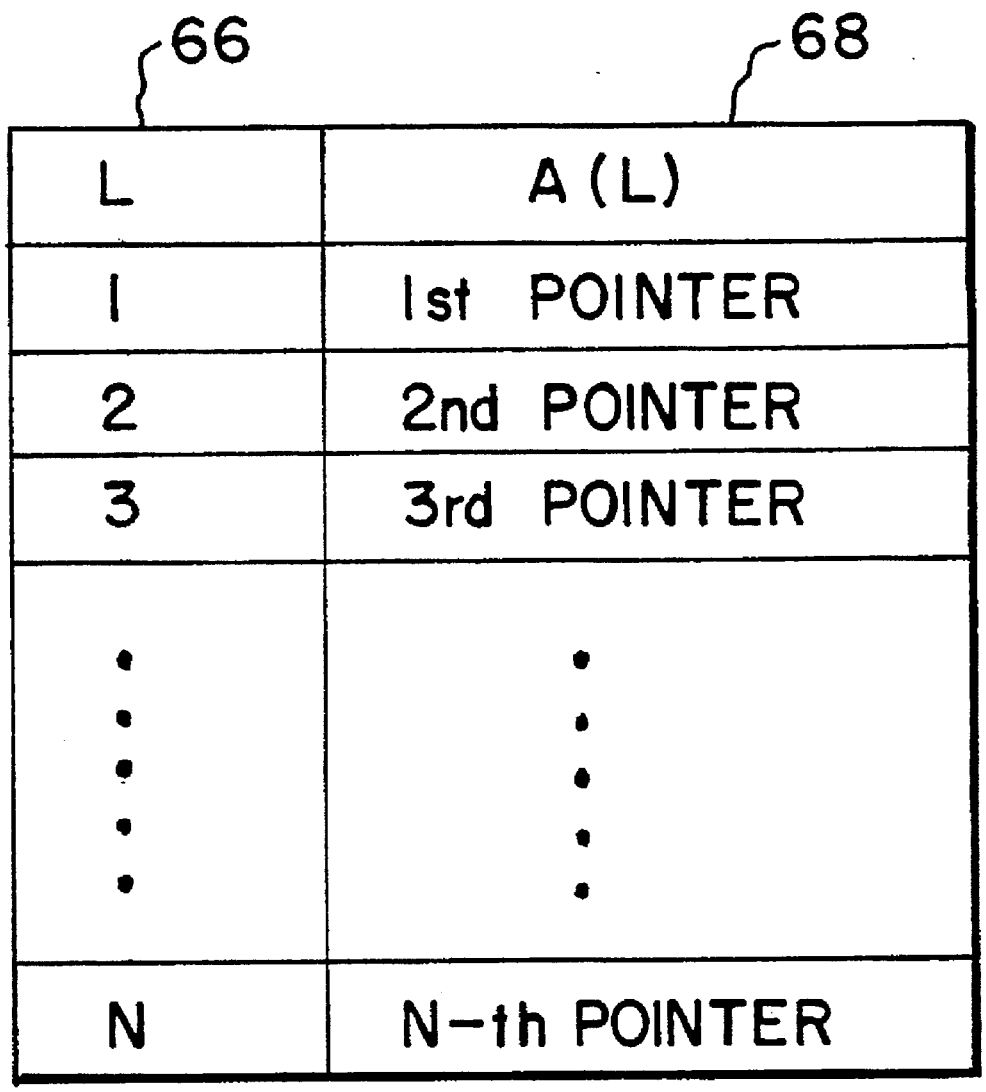
FIG. 5 is a representation showing an example of the construction of the address conversion table.

Returning to FIGS. 2 and 3, command processing section 34 communicates with CPU 10 via buffer 10. That is, the CPU command and data are DMA-transferred to buffer 37 under control of DMAC 12, and command processing section 34 fetches the command from buffer 37 and executes it. Since flash memory 32 is seen from CPU 10 as if it were a hard disk or floppy disk, the command transferred to buffer 37 is the same type as the command for such disk and contains sector address L in addition to the OP code. In external storage system 20, the sector address L is treated as logical address 66. Address conversion table 36 which provides the relationship between the sector address L (logical address 66) and physical address A (L) (pointer 68) of memory block 40 is held on RAM 54 with the construction as shown in FIG. 5.

Now, the operation of control unit 30 of external storage system 20 will be described. Command processing section 34 usually independently executes processes such as sector writing and block erasing. It receives the command and data from host CPU 10 by interruption. The normal processing is outlined in FIGS. 7–8.

Figure 7B:
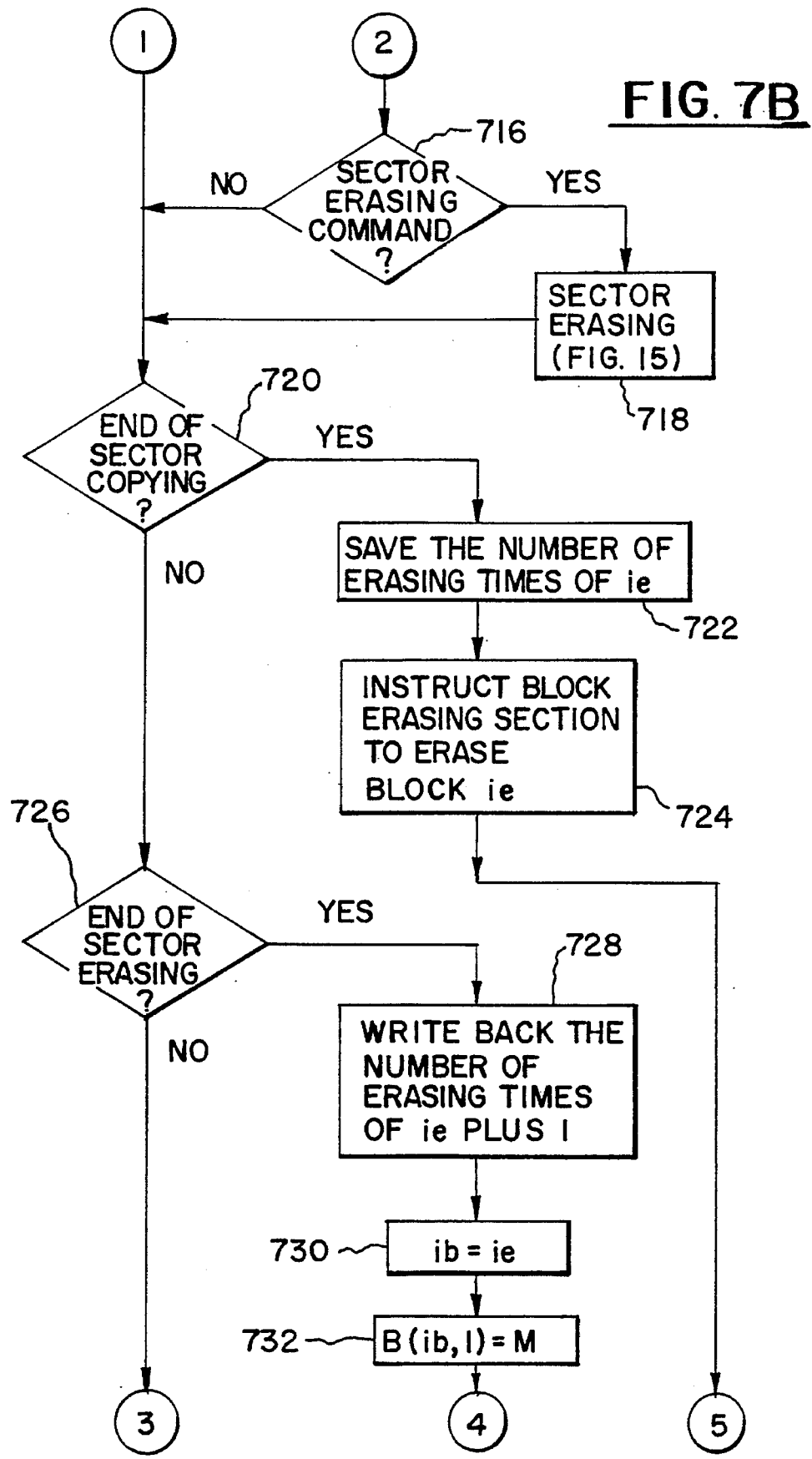
FIG. 7B is a flowchart showing the normal processing of the command processing section.
Figure 7C:
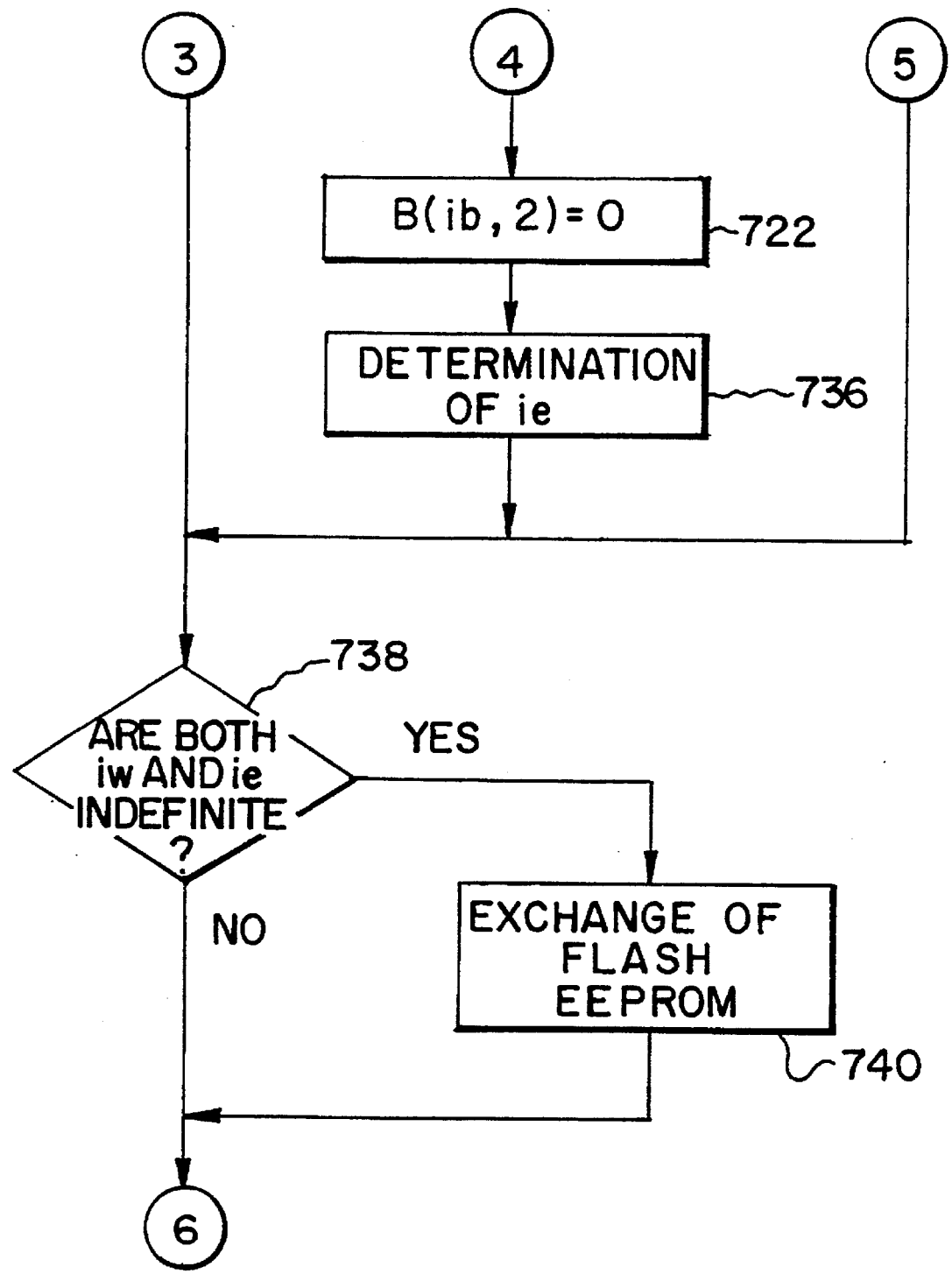
FIG. 7C is a flowchart showing the normal processing of the command processing section.

First, in the first step of FIG. 7(FIG. 7A–7C), the initialization of the block managing table and address conversion table is done (702). Then, it is determined whether or not file recovery is required for disconnection of the power supply or the like, and the process therefore is executed if necessary (704, 706). Next, it is checked whether there is any command sent from host CPU 10 to buffer 37 (708). If there is a write command, the existence of blank sectors in memory block 40 i checked (total number B (, 1)>0), and a writing is performed if there is a blank sector (710–714). If it is a sector erase command, the erasing process of the corresponding sector is done (716, 718). If a certain memory block is determined to be a memory block ie to be erased, the block erasing process (later described in detail) is started. In the block erasing process, the sector copy to other memory blocks is undertaken to save valid sectors as described later. When the sector copy is terminated, the command processing section holds the number of times the memory block was erased and thereafter commands block erasing section 43 to execute block erasing of the corresponding memory block ie (720–724). The number of erasing times is stored and managed in the first four bytes of the sector managing table, and it is incremented by one after completion of the erasure and written back (728). Then, the erased block ie is made to be blank block ib (730), the records of the sector managing table and block managing table 35 are updated. That is, the number B (i, 1) of empty sectors in the memory block i is made to be M and the number B (i, 2) of effective sectors is made to be 0 (732, 734).

However, if the number of erasing times of a certain memory block i to be collectively erased is smaller than that of a memory block ie, an erase candidate, by a certain value, the memory block i is selected as the memory block ie which is the erase candidate used to make uniform the number of erasing times, regardless of whether the number of the "valid" sectors is large or small (736). If there is no further memory block ie to be erased in all the memory blocks and no blank sector iw exists, the request for memory replacement is displayed on CRT 25 (FIG. 1) (738, 740). This display may be done earlier so as to leave time to spare.

Figure 8:
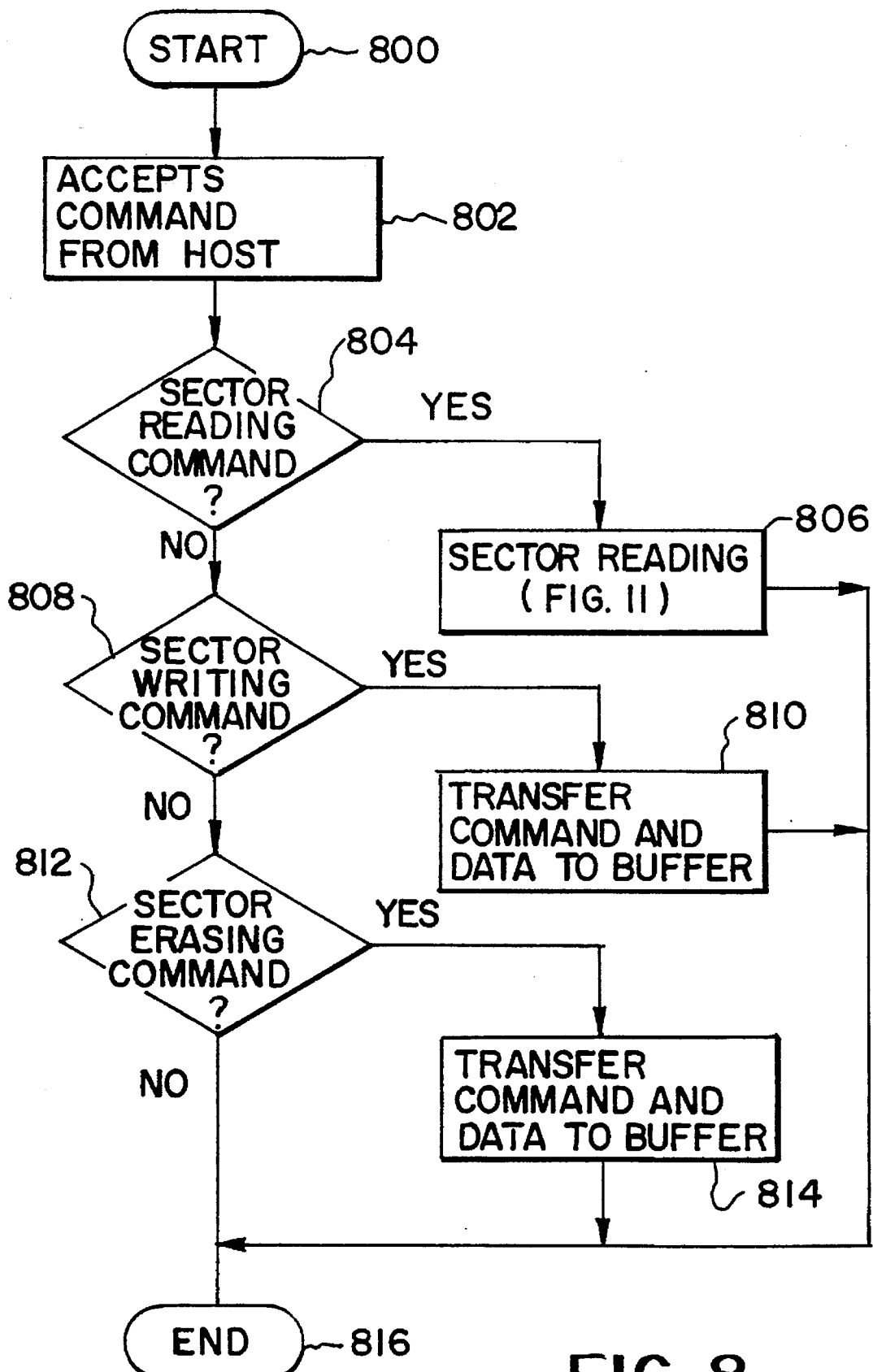
FIG. 8 is a flowchart showing the interruption processing of the command processing section.

The request for a processing from host CPU 10 to external storage system 20 is accepted by the previously mentioned interruption in the normal processing. As shown in FIG. 8, when command processing section 34 accepts a command from host CPU 10 (802), it executes the processings required for a sector reading (804, 806), a sector writing (808, 810) or sector erasing (812, 814). To execute each command, command processing section 34 looks up address conversion table 36 for the logical (sector) address 66 in the command and obtains the corresponding physical address 68. The physical address 68 consists of a block address (i) specifying a particular memory block 32i of flash memory 32, and a sector address (j) specifying a particular sector j in that block.

Figure 9A:
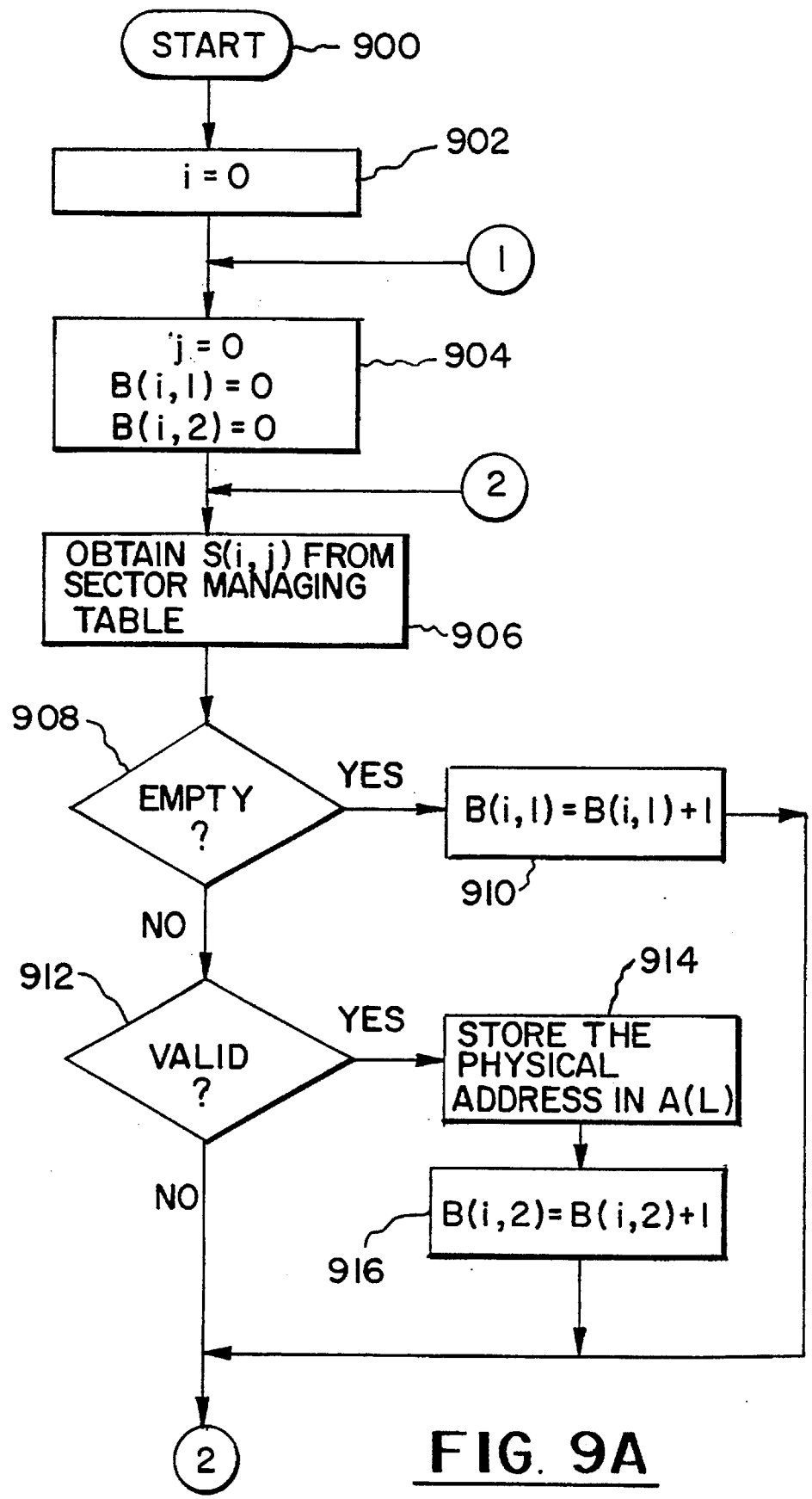
FIG. 9A is a flowchart showing the process of initializing the managing table and conversion table in FIG. 7A.
Figure 9B:
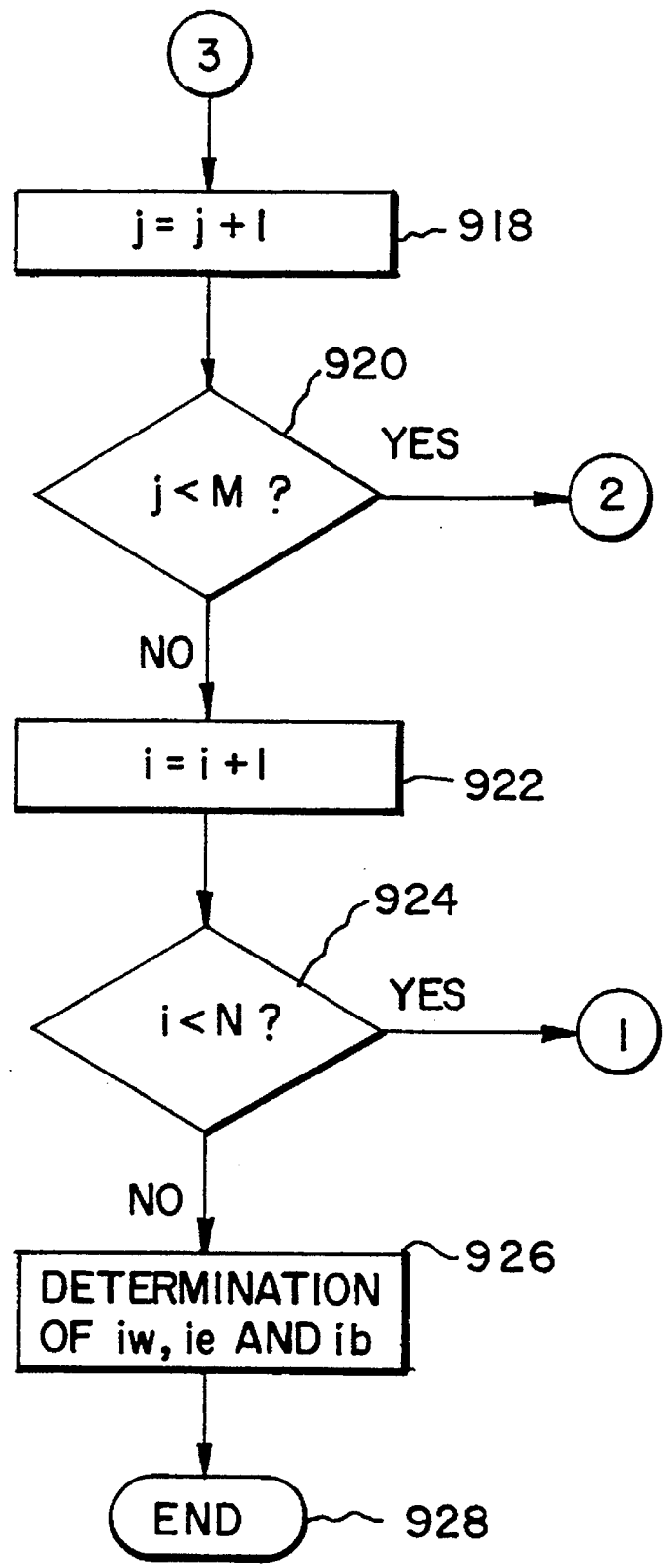
FIG. 9B is a flowchart showing the process of initializing the managing table and conversion table in FIG. 7A.

The details of each processing of the command processing section 34 will now be described. First, the initialization of the block managing table and address conversion table (FIG. 7A, step 702) is described. FIG. 9 (FIGS. 9A, 9B) shows the details of the initialization process of the block managing table and address conversion table. The block number i and sector number j are initialized, the number of empty sectors B (i, 1) and the number of valid sectors B (i, 2) are both set to zero (902, 904), and the status of the j-th sector in block i and data S (i, j) of pointer L are obtained from sector managing table 60 (906). If the sector is vacant, add one to the number of blank sectors B (i, 1) in block i. If the sector is not vacant, then the sector is checked for validity, and if it is valid, physical address 68 is stored in L-th A (L) of address conversion table 36 (914) and one is added to the number of valid sectors B (i, 2) (916). A similar processing is executed until sector number j reaches the total number of sectors M in block i (920). Further, a similar processing is repeated for all blocks N (922–924). The number iw of the block in which a sector writing is performed, the number ie of the candidate block for erasure, and the number ib of the blank block in which data is to be saved for the erasure are determined (926).

The file recovery (FIG. 7A, step 706) is described below. In the conventional magnetic disk file, data is overwritten on the sector when the sector is rewritten, and thus, if a power failure occurs in the course of rewriting a file for instance, both old and new files would be lost. On the other hand, in the present invention, a new sector is found for the sector rewriting without overwriting the old sector, and thus the old data continues to be valid until the block including the data is erased (however, the status flag of the sector has already been rewritten to invalid). Accordingly, if a file writing has failed, it is possible in most cases to find old sector 66 from the value of L in S (i, j) and reproduce the file regardless of status flag 64.

Figure 10:
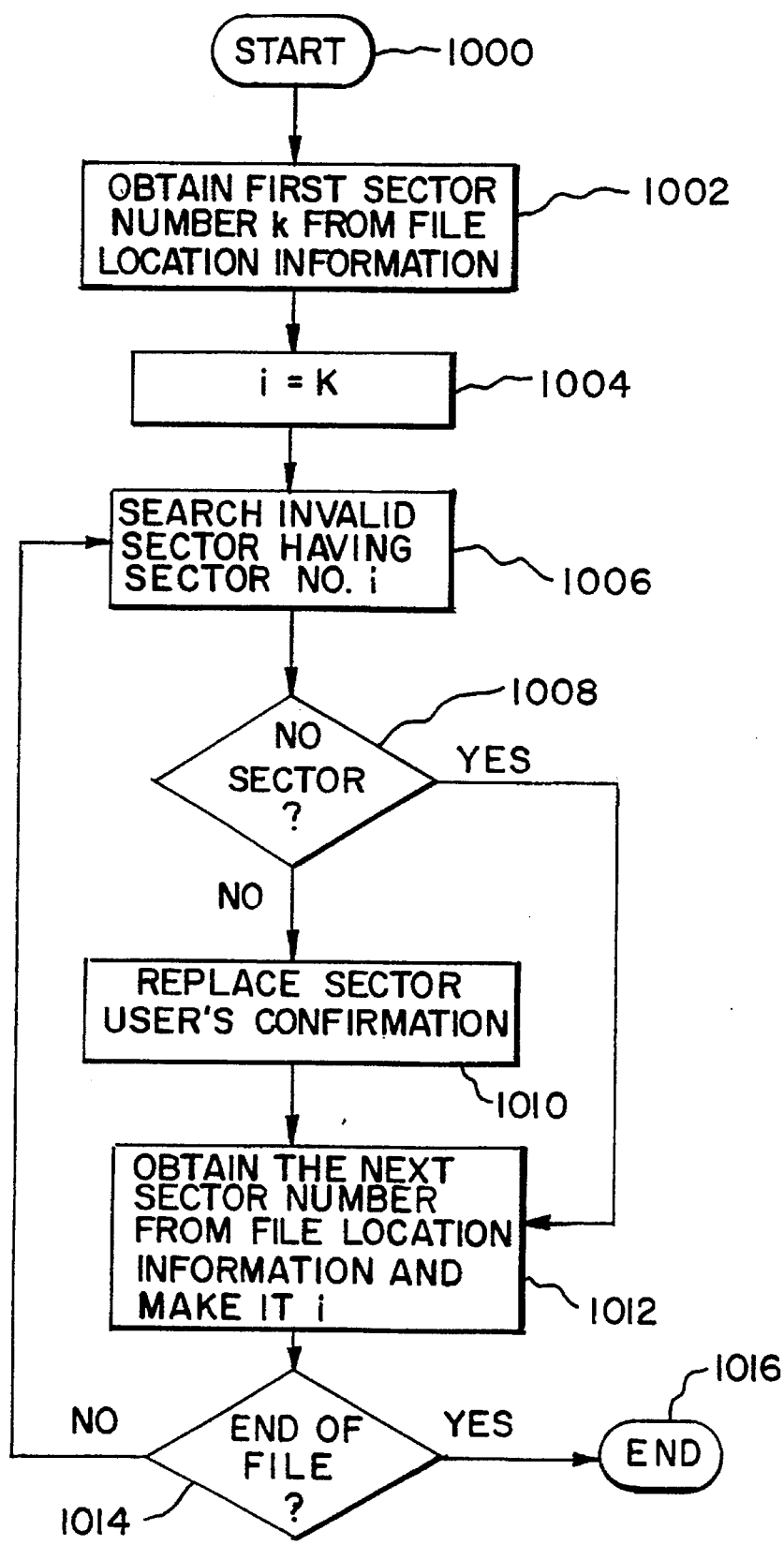
FIG. 10 is a flowchart showing the detail of the file recovery processing in FIG. 7A.

FIG. 10 shows details of the file recovery. If the power supply is disconnected during a file writing by an accident or the like, the data in buffer 37 or RAM 54 is lost. Then, the old file is recovered when the power is turned on again. First, the directory information and file allocation information are read out to obtain the leading sector number K of the file (1002, 1004). As the sectors corresponding to the sector numbers written until the power was turned off, both invalid sectors having old data and valid sectors having new data exist. Then, an invalid sector having the sector number K is searched, and if there is one present, the data of the sector is moved to a new blank sector after obtaining the user's confirmation to make it valid. The existing valid sector is made invalid (1010). The user's confirmation is obtained because, if the old data comprises plural versions, confirmation is obtained as to which one should be selected. A similar processing is done for all the sectors constituting the file (1014). The old file is reconstructed by gathering the data of invalid sectors in this way.

Figure 11:
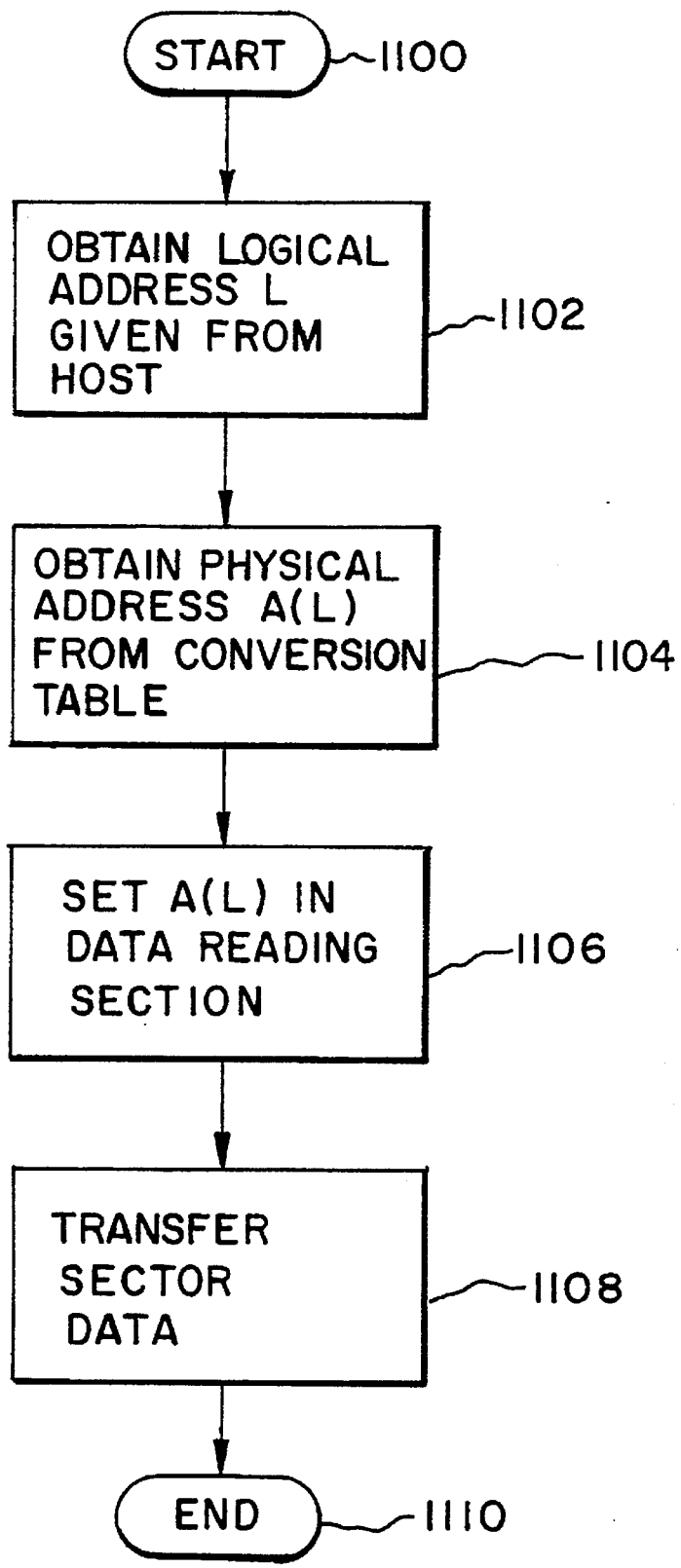
FIG. 11 is a flowchart showing the detail of the sector read processing in FIG. 8.

FIG. 11 is a detailed flow of the sector reading (step 806 of FIG. 8), in which a physical address A (L) 68 corresponding to a given logical address L 66 is obtained from address conversion table 36, the positions sectors 70A–70N are found, and data (AL) is set in data reading section 40 and DMA-transferred to CPU 10.

Figure 12:
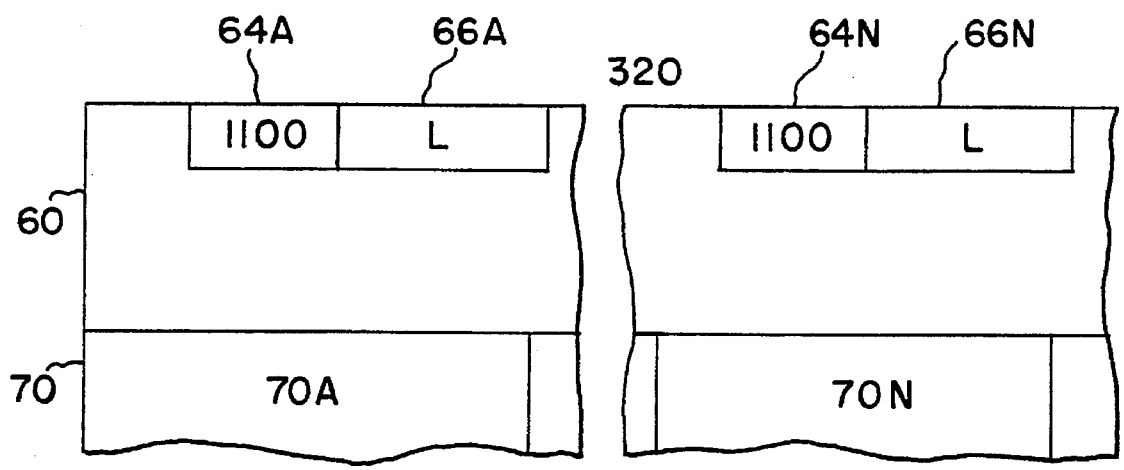
FIG. 12 is a representation explaining the sector write processing.

Now, the sector write processing (step 714 of FIG. 7A) is described. In FIGS. 2 and 12, command processing section 34 first obtains the logical address L given by host CPU 10 from buffer 37, and then looks up address conversion table 36 to obtain physical address A (L). Further, it traverses block managing table 35 to find the position of the blank sector 70N in data region 70. And, it reads out the data received from host CPU 10 from buffer 37, writes this new data into the blank sector 70N, and rewrites its status flag 64N from "blank" to "valid" and the status flag 64A of the old sector 70A from "valid" to "invalid." Then, it stores the correspondence between the logical address 66 and the physical address of the new sector 70N specified by host CPU 10 in address conversion table 36, and the record of the block managing table is renewed as to the number of blank sectors (i, 1), the number of valid sectors (i, 2) and the total number of empty sectors B (, 1). Incidentally, the memory block iw containing the new sector 70N may exist in the same memory block 320 as the old sector 70A or in another memory block.

Figure 13A:
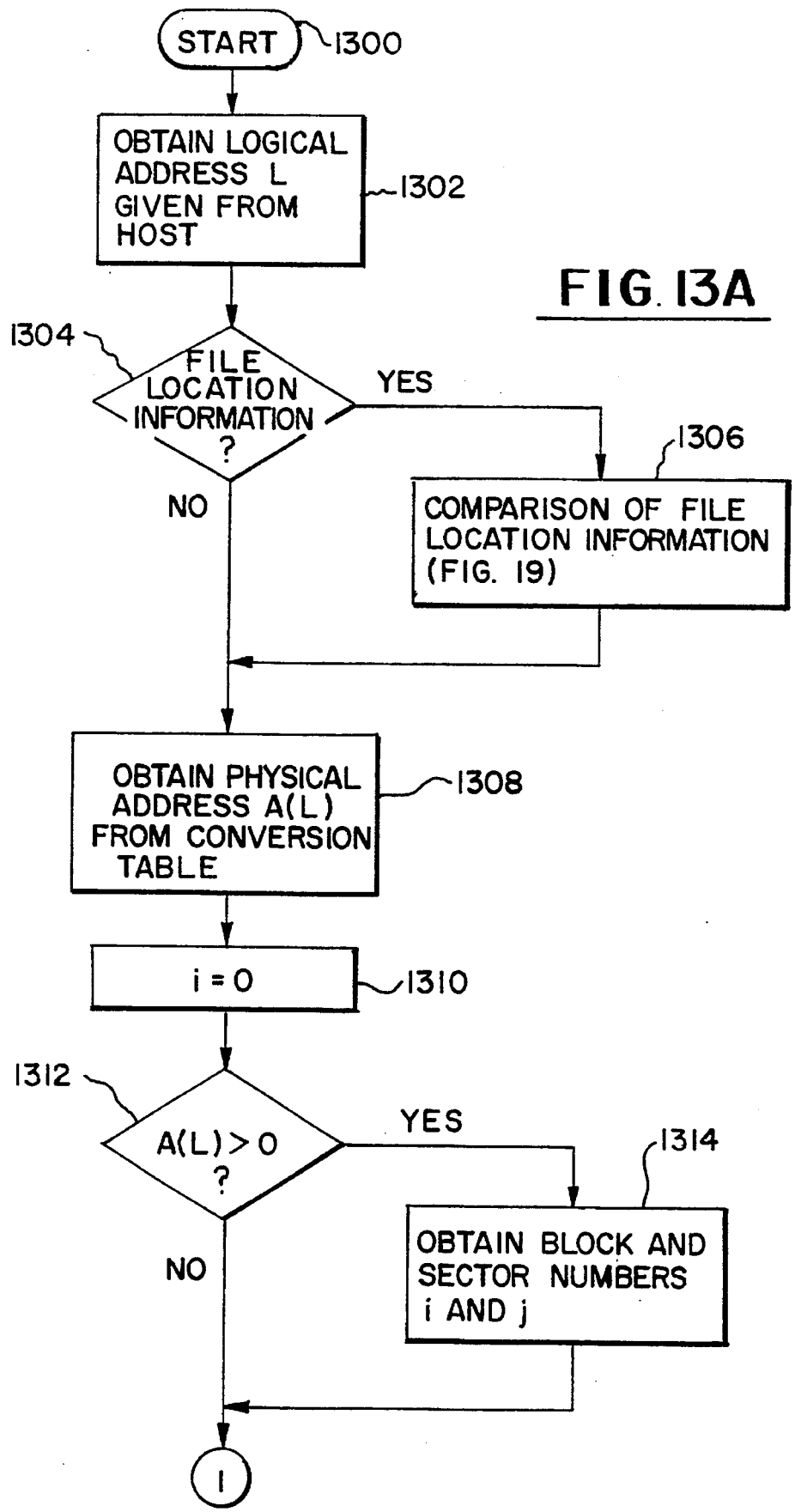
FIG. 13A is a flowchart showing the detail of the sector write processing in FIG. 7A.
Figure 13B:
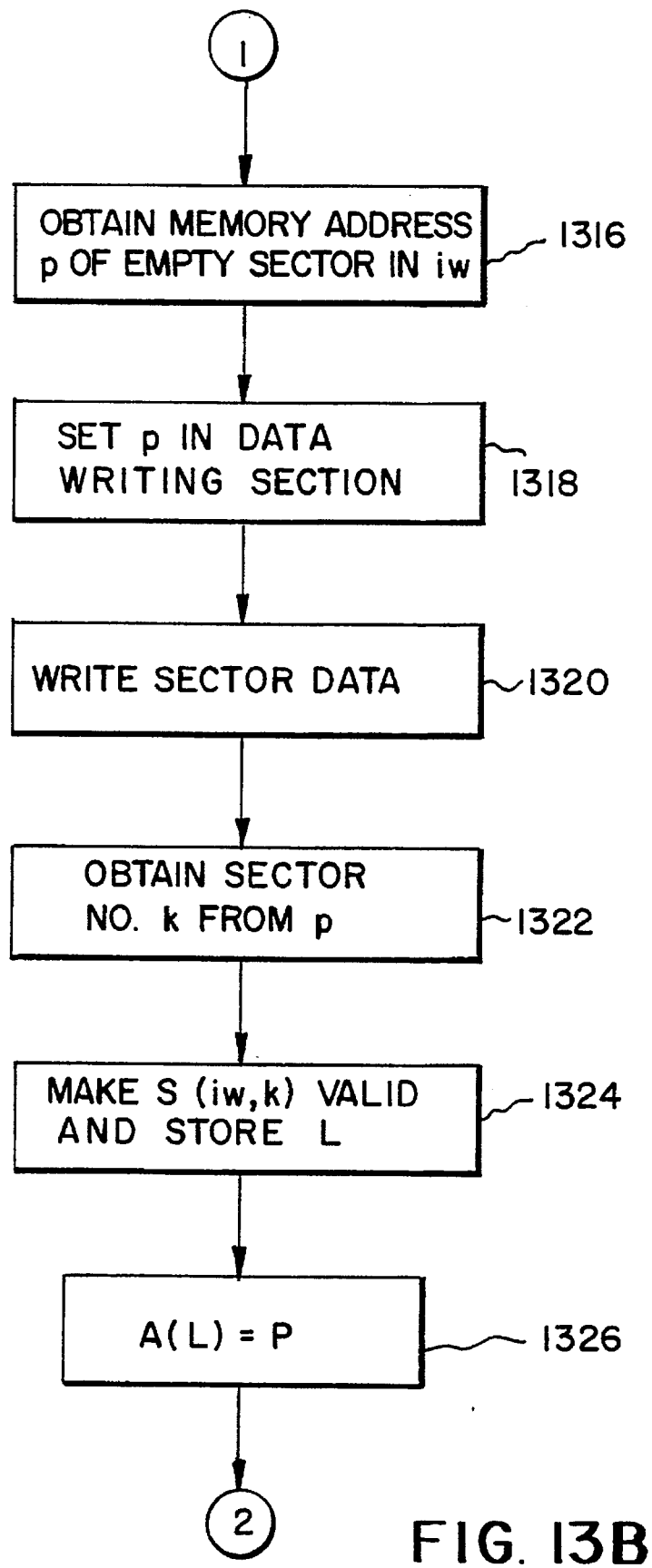
FIG. 13B is a flowchart showing the detail of the sector write processing in FIG. 7A.
Figure 13C:
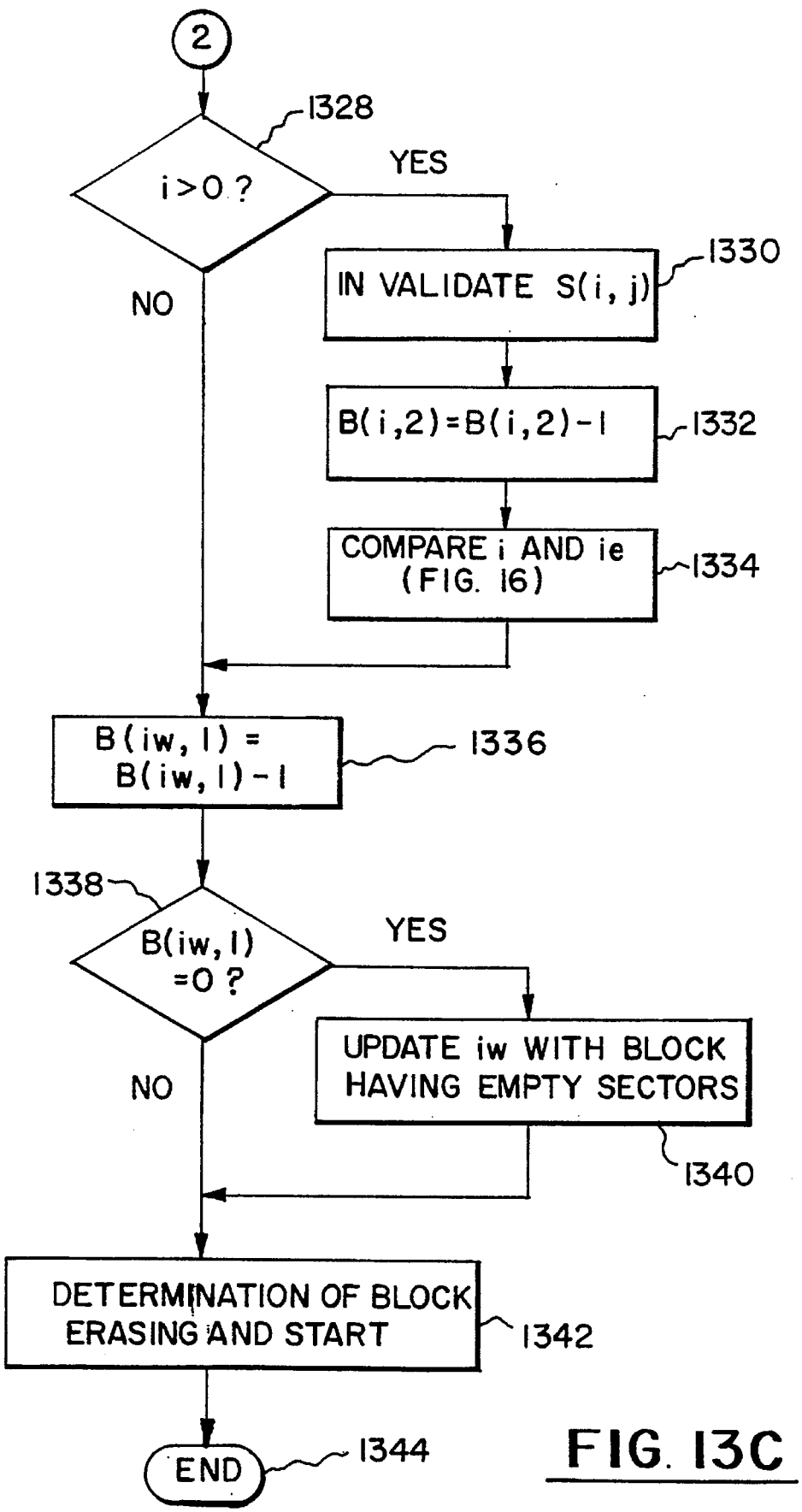
FIG. 13C is a flowchart showing the detail of the sector write processing in FIG. 7A.

FIG. 13 (13A–13C) shows details of the above sector write processing.

First, the logical address L included in the command given from host CPU 10 is obtained (1302). And, if the processing of the later decribed file allocation information is required, that processing is done (1304, 1306) and then the physical address A (L) is obtained from address conversion table 36 (1308). Further, the old memory number i and sector number j are obtained for the A (L) (1314). Then, the memory address P of the blank sector in the memory block iw in which the writing is done is obtained, and this P is set in data writing section 41 and the sector data is written (1316–1320). In addition, the sector number k of the writing destination is obtained from P, the data S (iw, k) of the pointer is made valid, L is stored, and P is made to be the physical address A (L) (1322–1326). Then, in order to logically erase the old data at the same logical address, the value S (i, j) of the old pointer L of the memory block is made invalid (1330) and the number of valid sectors B (i, 2) is decreased by one (1332). Moreover, it is determined whether or not the block i is that to be erased next (1334), and the number of blank sectors B (iw, 1) is reduced by one (1336). And, if the number of blank sectors becomes 0, the memory block having blank sectors is renewed as the memory block iw in which next writing is done (1340). However, the blank memory block selected as the copying memory block for saving the sector data is excluded. Finally, the determination of the block erasing and the processing are done (1342).

Figure 14:
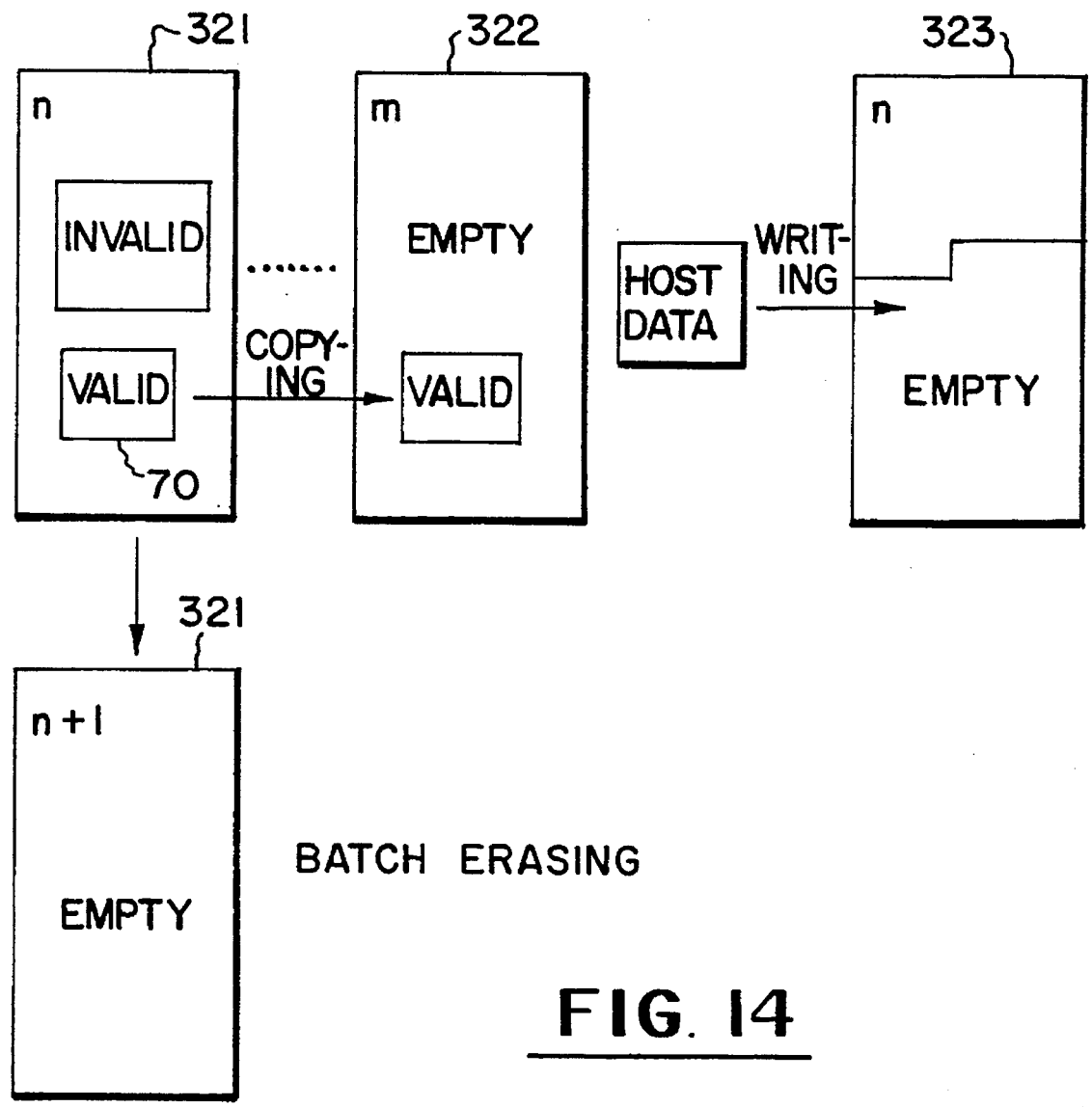
FIG. 14 is a representation explaining the sector erase processing in FIG. 7A.
Figure 15:
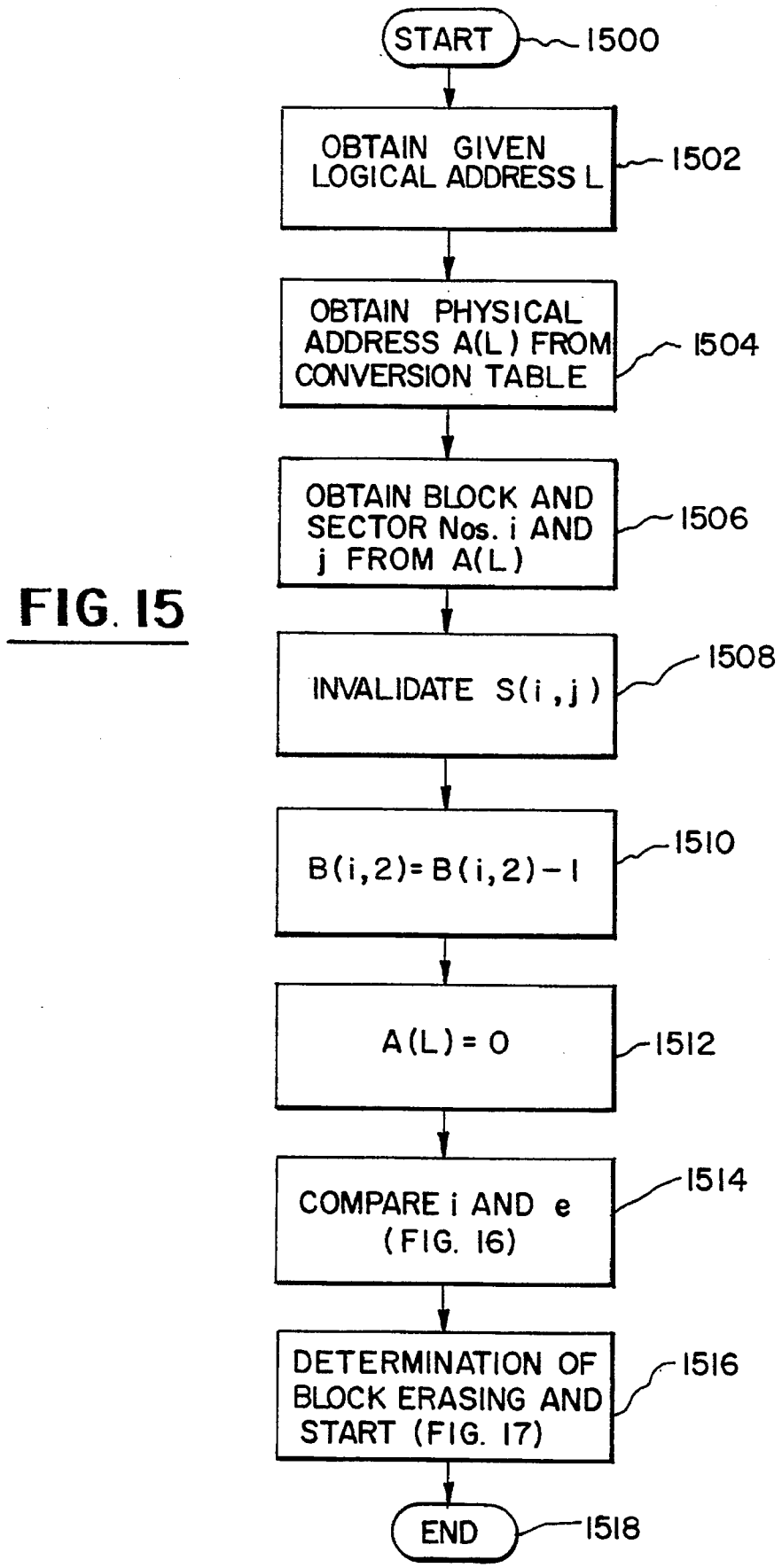
FIG. 15 is a flowchart showing the detail of the sector erase processing in FIG. 7A.

The procedure of sector erasing (step 718 of FIG. 7B) is now described in detail according to FIGS. 14–15.

In FIG. 15, each time the status flag of the sectors of a certain memory block i changes from "valid" to "invalid" command processing section 34 invalidates the value S (i, j) of the pointer (1508) and decrements the number of "valid" sectors B (i, 2) in the memory block i in the block managing table by one (1510). This logically erases the sector data, and physically holds it as it is valid. And, the physical address A (L) of the address conversion table is made to be zero, and the number of the remaining "valid" sectors is compared with the erase candidate memory block ie. If the number is smaller, this memory block i is selected as a candidate ie of the memory block to be erased next (1514).

In this embodiment, the number of "blank" sectors is always kept greater than a fixed value by the block erasing processing based on the block managing table and sector managing table. The "blank" sectors are used as destinations at which data is written or copied at the time of data writing or erasing. As shown in FIG. 14, there are many "empty" sectors initially existing in one memory block 321, but "valid" sectors and "invalid" sectors gradually increase. And, when the number of "valid" sectors 70 remaining in the memory block 321 becomes smaller than the predetermined value, the "valid" sectors 70 are copied into "empty" sectors in another memory block 322, and then the content of the memory block 321 is erased in bulk to make them all "blank" sectors.

The command from CPU 10 is executed by interruption even during the processing of copying sectors or erasing memory blocks. For instance, if the command of CPU 10 is for data writing, a memory block 323 other than the memory block 322 which is currently copying data is selected, and a writing process is done in parallel with the copying. Consequently, the interrupt function (parallel processing) is executed as long as blank sectors are secured, and thus the execution of the command from CPU 10 is not to wait.

Figure 16:
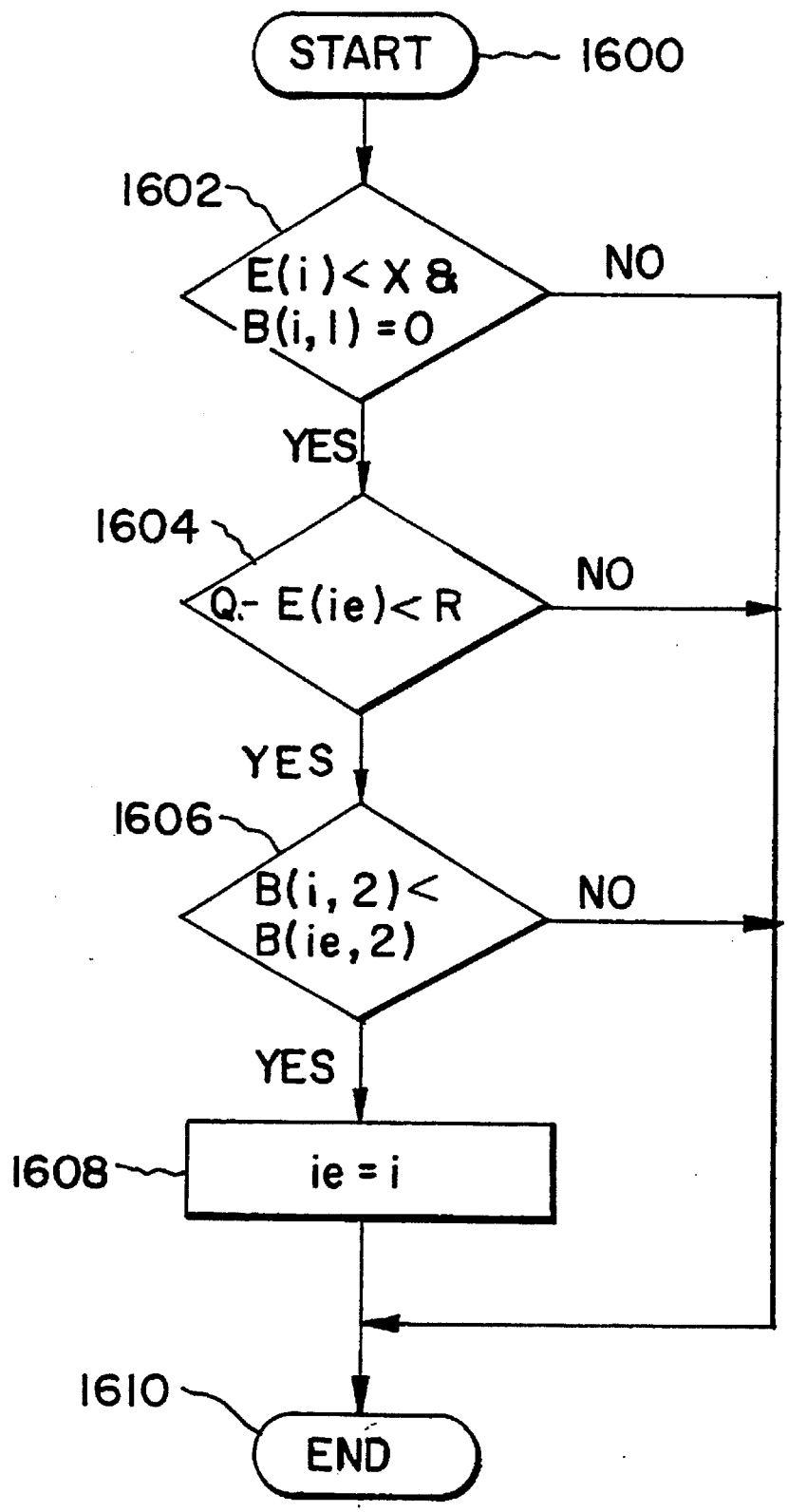
FIG. 16 is a flowchart showing the detail of the compare processing of i and ie in FIG. 15.
Figure 17:
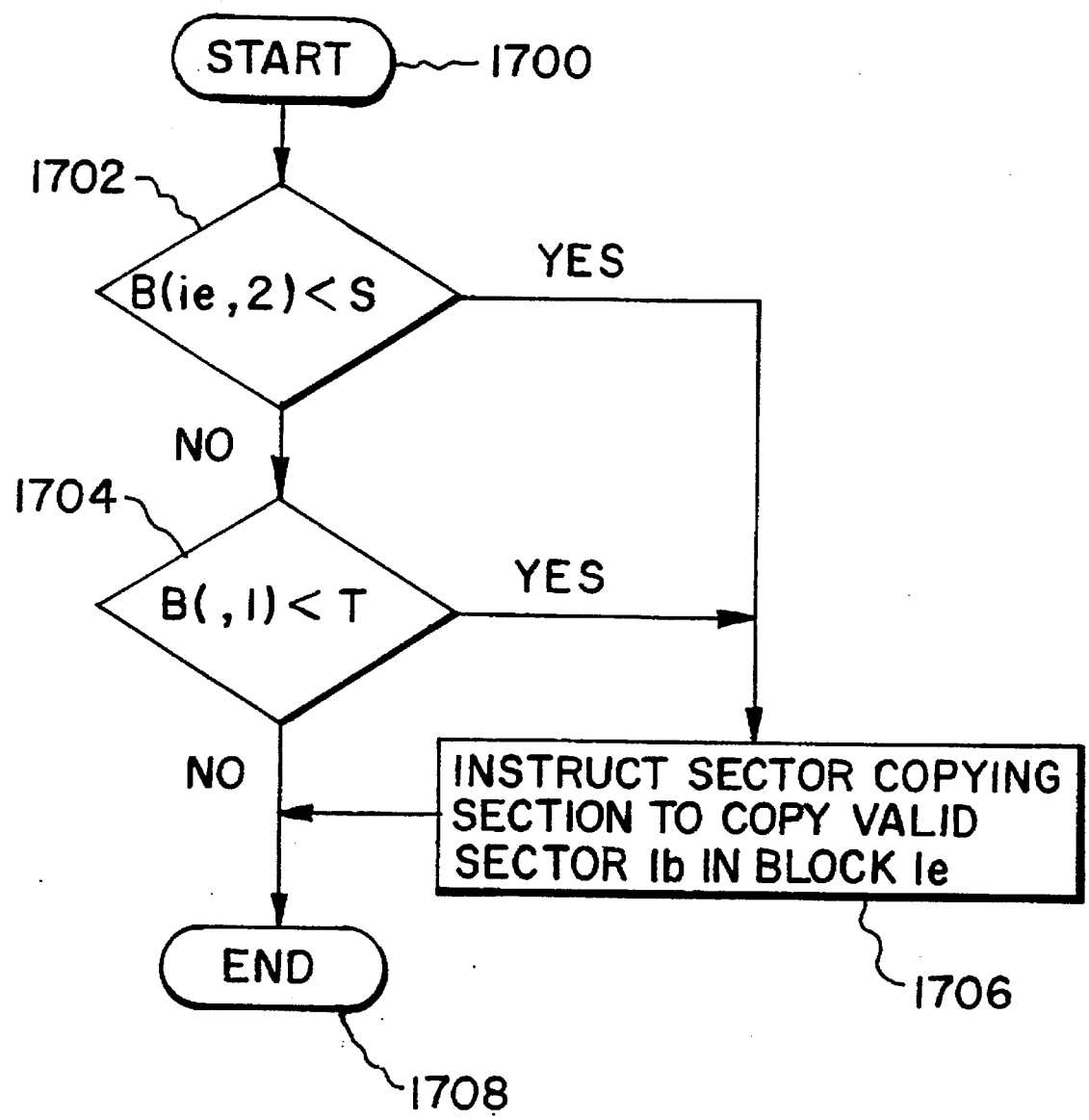
FIG. 17 is a flow chart showing the detail of the block erase determination and start in FIG. 15.

Incidentally, since it takes time to copy the data of valid sectors prior to block erasure, the number of copying times is preferably as small as possible. Accordingly, in step 1334 of FIG. 13C and step 1514 of FIG. 15, a processing is done to minimize the number of valid sectors of the memory block to be erased, thereby suppressing the amount of copying to a small value. For this, if a certain sector now becomes invalid, the number of valid sectors of the memory block i including that sector is compared with the number of valid sectors of the erasing candidate memory block ie to determine the next erasing candidate. The details of this are shown in FIG. 16. First, the number of erasing times E (i) of a memory block i in which a sector has now become invalid is compared with the upper allowance value X of the number of erasing times of that memory. This upper limit value X is set to, for instance, 10,000 times or 100,000 times depending on the specification of the memory block. If X is exceeded or there are blank sectors B (i, j) in the memory block i, it is not necessary to change the erasing candidate and the determination terminates (1602, 1610). If E (i) has not yet reached the upper limit X, then it is checked whether or not the difference between the memory block having the largest number of erasing times Q among the all memory blocks and the number of erasing times E (ie) of the erasing candidate memory block ie is equal to or smaller than the maximum allowed value R for deviation of the number of erasing times (1604). R, an appropriate value between 100–1000 is selected for instance. If the deviation is larger than R, the examination of the memory block i is not required and the determination terminates. If, conversely, it is smaller than R, comparison of the number of valid sectors B (i, 2) is done (1606). If the memory block i has only valid sectors B (i,2) less than the erasing candidate memory block ie, the memory block i is newly replaced as the next erasing candidate memory block ie (1608). Incidentally, since the total number of sectors in the memory block i is known, it is not necessary to say that the comparison of i and ie may be done by the number of invalid sectors instead of the number of valid sectors. Referring to FIG. 17, the detail of the determination processing of block erasing (step 1342 of FIG. 13 C and step 1516 of FIG. 15) is described. First, the number of valid sectors B (ie, 2) of the erasing candidate memory block ie is compared with a predetermined value S (1702), and if the number of valid sectors becomes smaller, sector copying section 42 is instructed to copy and save the valid sectors in the block ie to the memory block ib for copying (1706). The next writing or copying processing is hindered if the number of the blank sectors in all the memory blocks is small though there are many valid sectors. Thus, if the total number of blank sectors B(, 1) is smaller than a predetermined value T, sector copying processing is similarly performed for erasing (1704, 1706).

Figure 18:
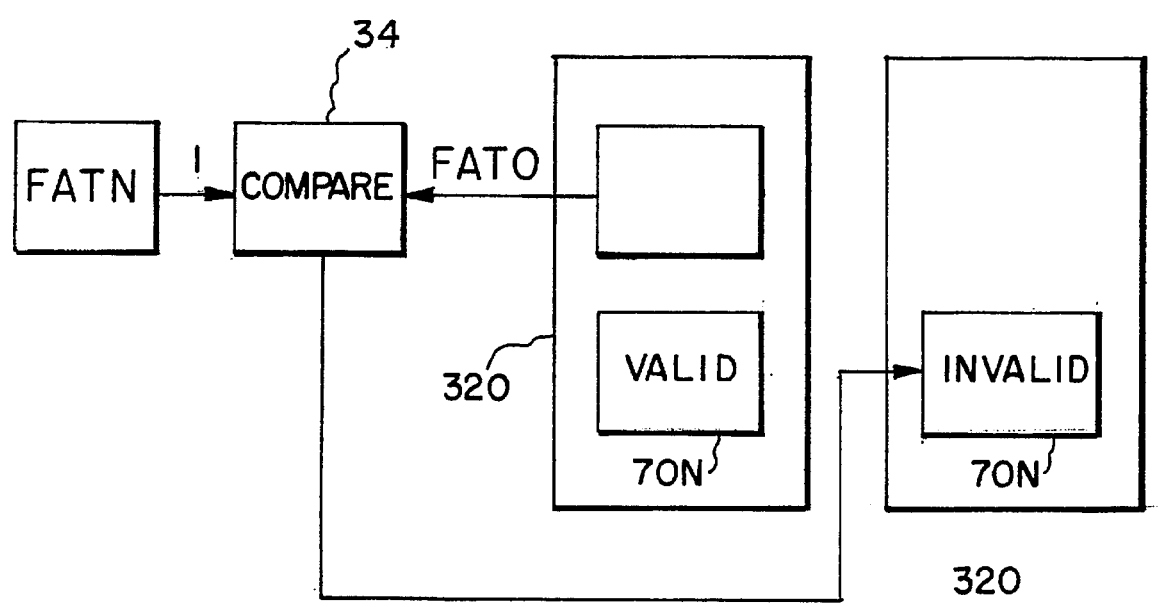
FIG. 18 is an explanatory view of an example of sector erasing by comparison of the file location information.
Figure 19:
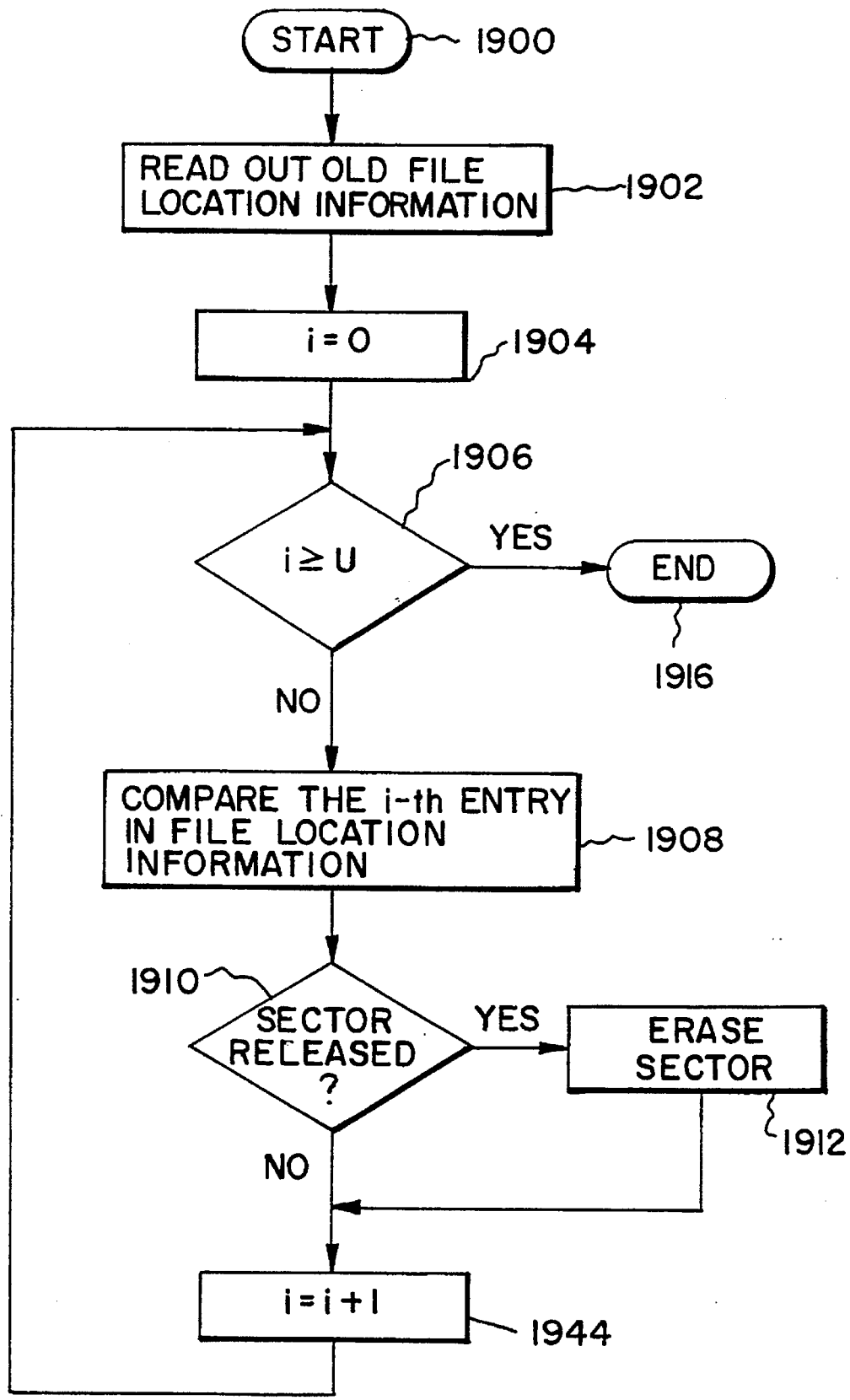
FIG. 19 is a flowchart showing the details of the sector erasing of FIG. 18.

To efficiently reproduce blank sectors, it is needed to know the sectors erased by the host CPU as early as possible. However, the conventional file system only updates the file allocation information when a file is erased by CPU 10, and it does not inform the external storage of which sectors were erased. In accordance with the embodiment of the present invention, when the file system was rewritten (step 1304 of FIG. 13A), this problem can be solved by comparing the file allocation information as shown in FIGS. 18 and 19 without rewriting the file system. That is, command processing section 34 has a function which compares the new and old file allocation information FAT. For this, the file allocation information is utilized for which CPU 10 manages the logical address L. When the file system is rewritten by CPU 10, that information is stored at a specific logical address L by the operating system OS. Then, the old file allocation information FATO on the external storage side is read out (1902) and compared with each entry U of the new file allocation information FATN at the CPU 10 side (1908), and if there is a sector 70N which was newly freed, sector erasing processing of the sector 70N is done (1912). A similar processing is performed for all entries to update the sector status on the external storage side.

Figure 20:
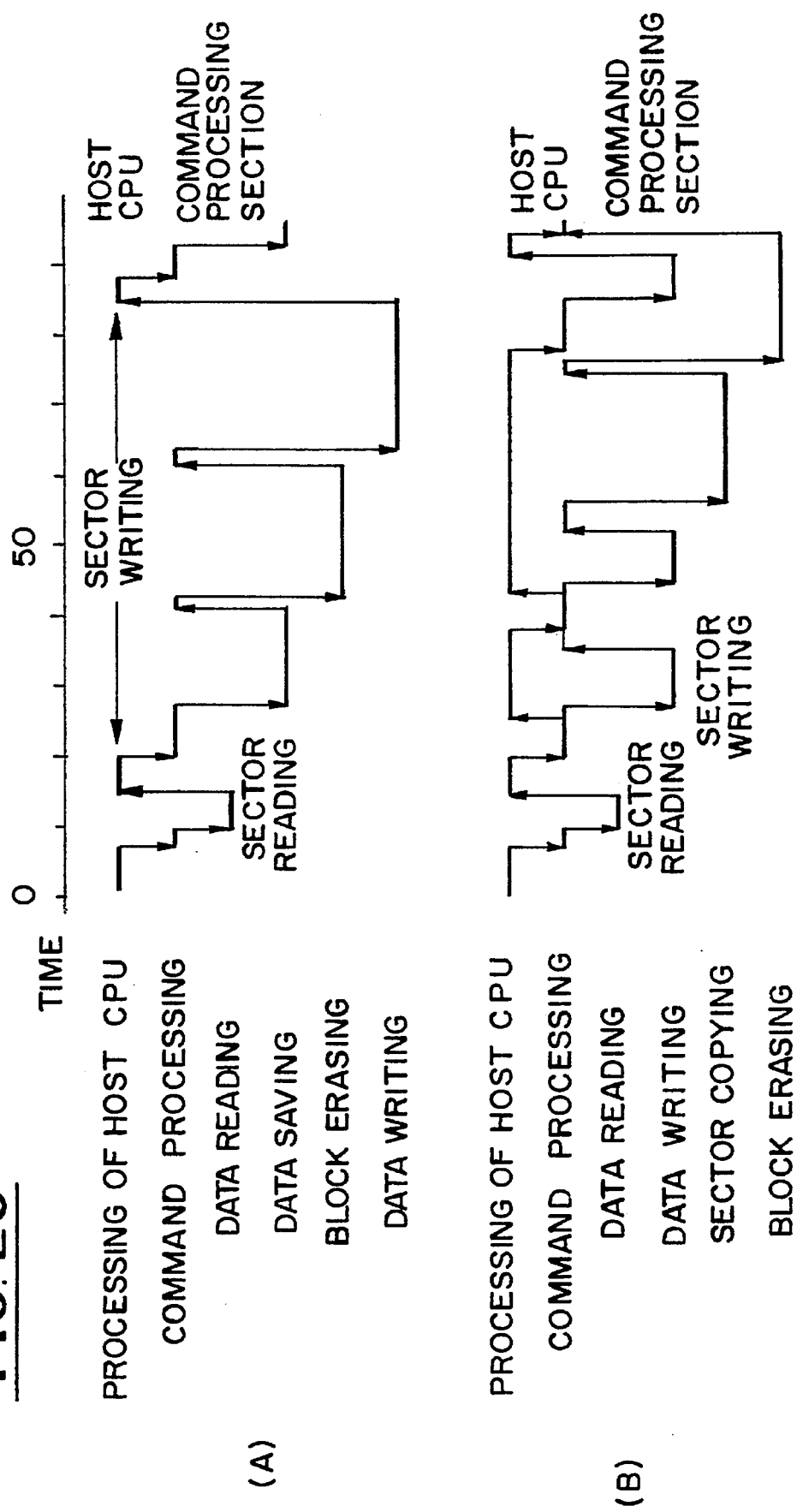
FIG. 20 is a time chart diagram showing the relationship between the normal processing of the command processing section in FIG. 2 and the interruption processing of CPU.

In accordance with the above described embodiment of the present invention, all the sectors are substantially uniformly used and a high-speed sector writing is enabled. FIG. 20 shows a comparison of the processing times for sector writing in the conventional scheme (A) and the scheme of the present invention (B). In the conventional scheme, a block is erased after all the data in the block are saved in the main memory or buffer at the beginning, and thereafter the data are written back to the memory block along with the newly updated data. Usually there are about 64–256 sectors in a block, and it takes a considerable amount of time to read out and write back all of them. The processing in the host CPU is interrupted during that time. On the other hand, in the scheme of the present invention (B), as the processing by CPU 10 for sector writing, it is only needed to write one sector, which eliminates the need for the data saving processing that has conventionally been required, and the block erasing is independently executed in command processing section 34 in parallel with the (other) processing of CPU 10. Accordingly, a fairly high speed sector writing as compared with the conventional scheme, in other words, the shortening of the binding time of CPU 10 is allowed. The reason for this is that the present invention manages memory blocks and sectors so as to always separately prepare a memory block in which sectors are written a memory block to be erased and a blank memory block. This allows the parallel execution of a sector writing and a memory block erasing, and a sector writing and a memory block erasing.

Figure 21:
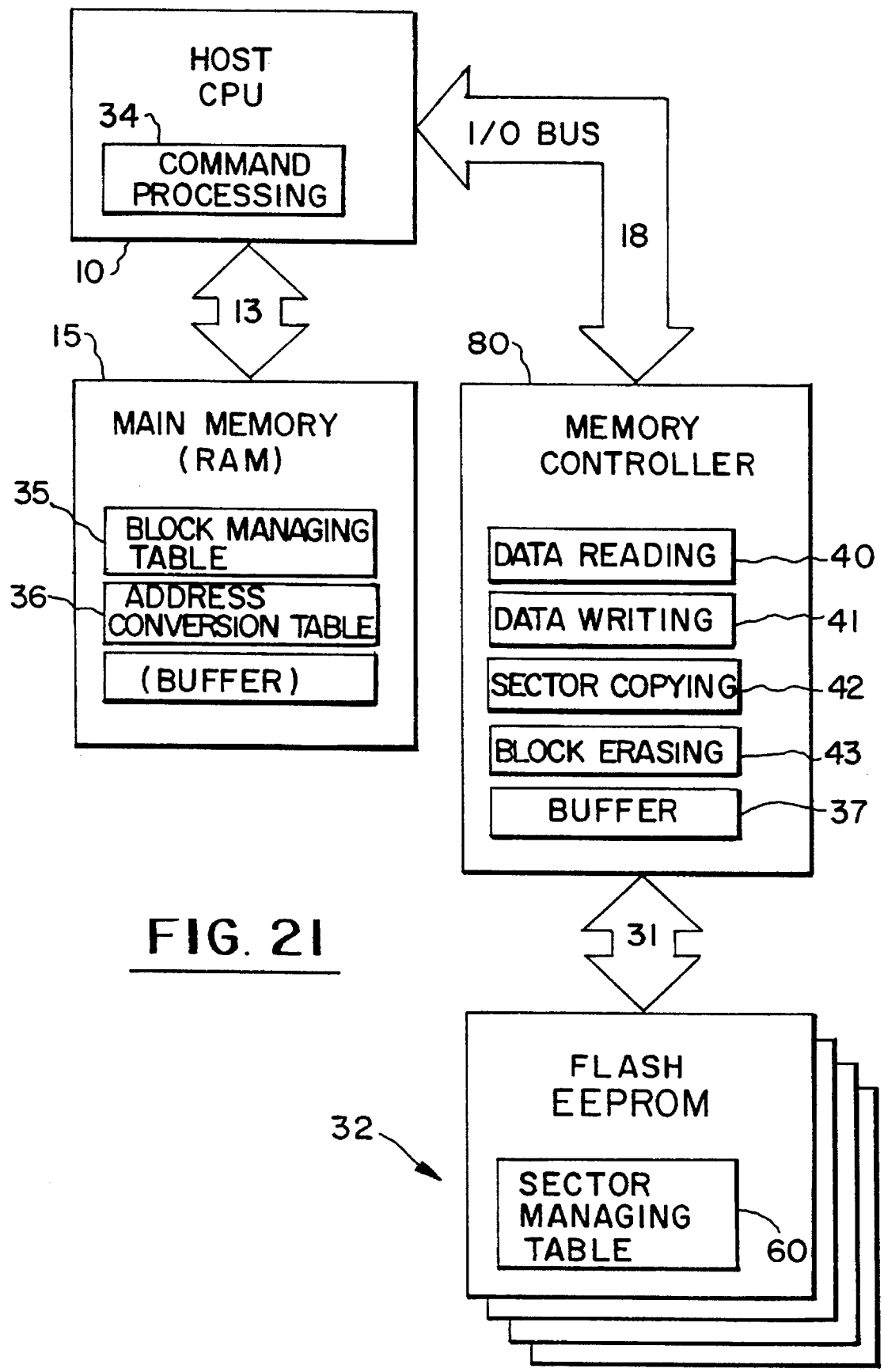
FIG. 21 is a representation showing an example of the computer system in which the semiconductor external storage system according to another embodiment of the present invention is incorporated.

FIG. 21 shows another embodiment of the present invention, which is different in that command processing function 34 is provided by host CPU 10, as compared with the example of FIG. 2. Also, block managing table 35 and address conversion table 36 are located on main memory 15 (including a buffer) and referenced by the host CPU. Host CPU 10 sends an instruction to memory controller 80 via I/O bus 18 for a sector reading or writing. The memory controller is formed as an integrated circuit on a silicon substrate which is separate from the host CPU, and provides the functions of data reading 40, data writing 41, sector copying 42 and block erasing in addition to buffer 37. Memory controller 80 can access to flash memory 32 independently of host CPU 10, and notify the host CPU of the end of a task via I/O bus 18. Since the other operations are the same as the embodiment of FIG. 2, the explanation thereof is omitted.

Figure 22:
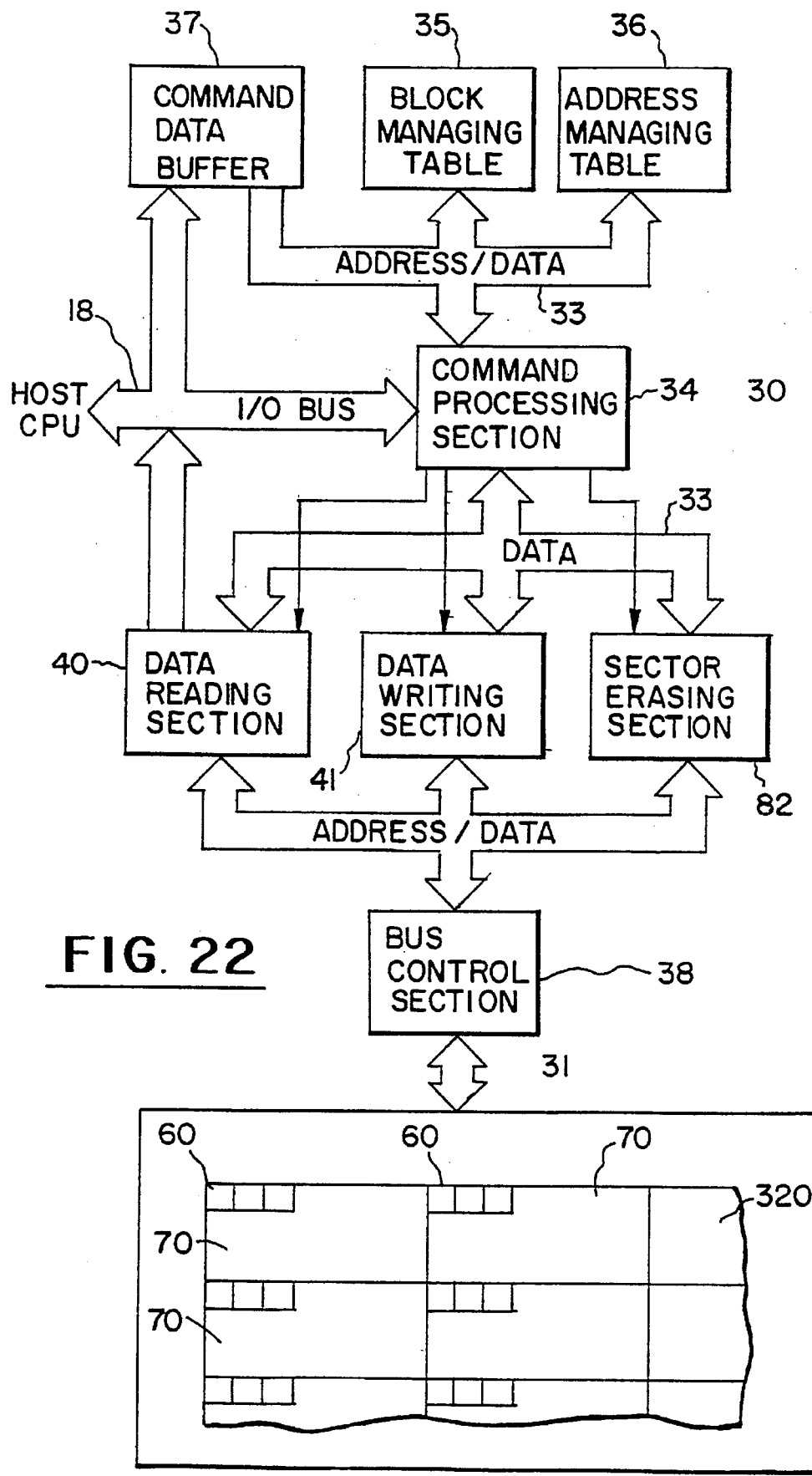
FIG. 22 is a representation showing an example of the computer system in which the external storage system according to still another embodiment of the present invention is shown.
Figure 23:
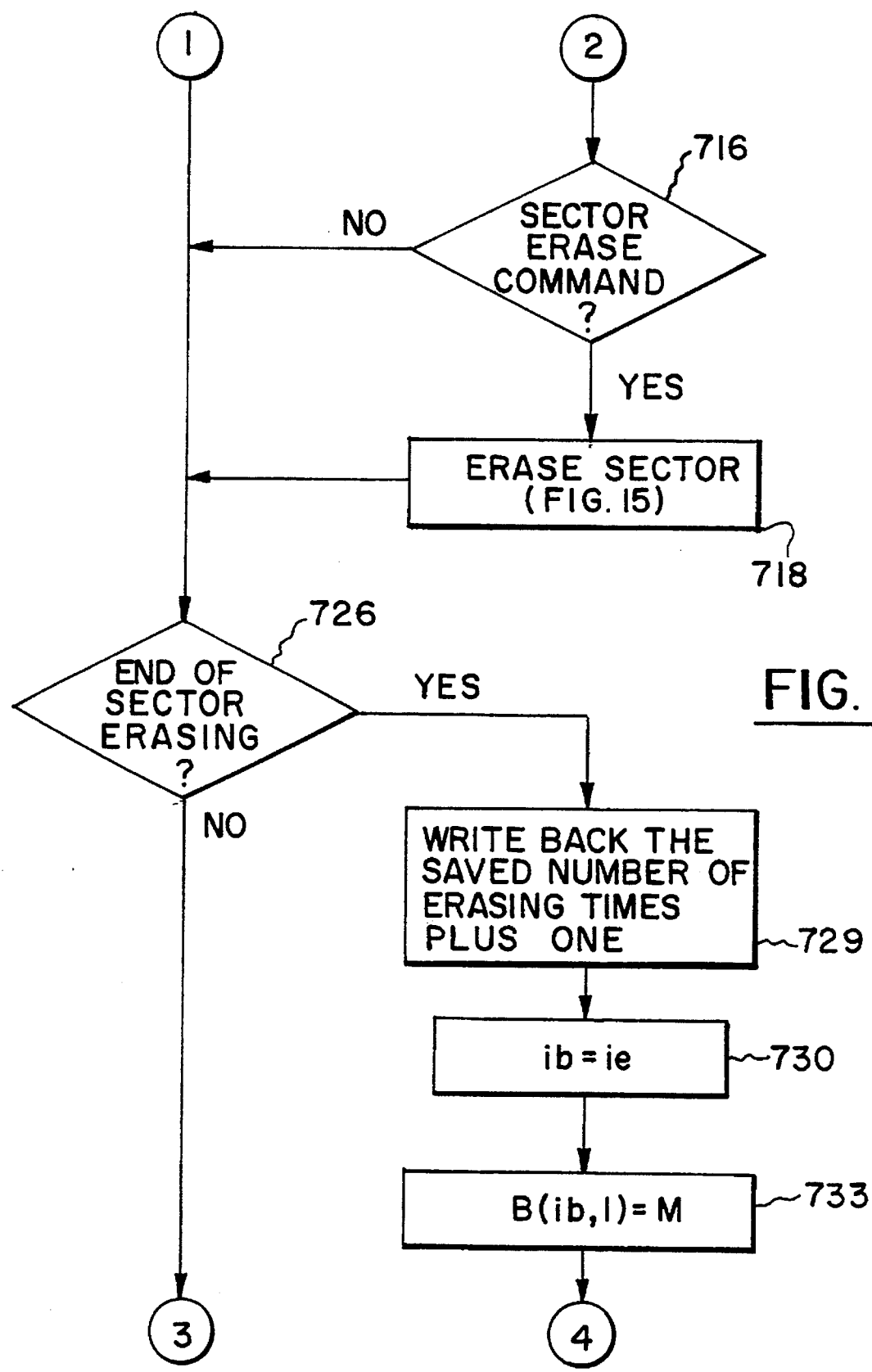
FIG. 23 is a flowchart showing part of the normal processing of the command processing section in FIG. 22.
Figure 24:
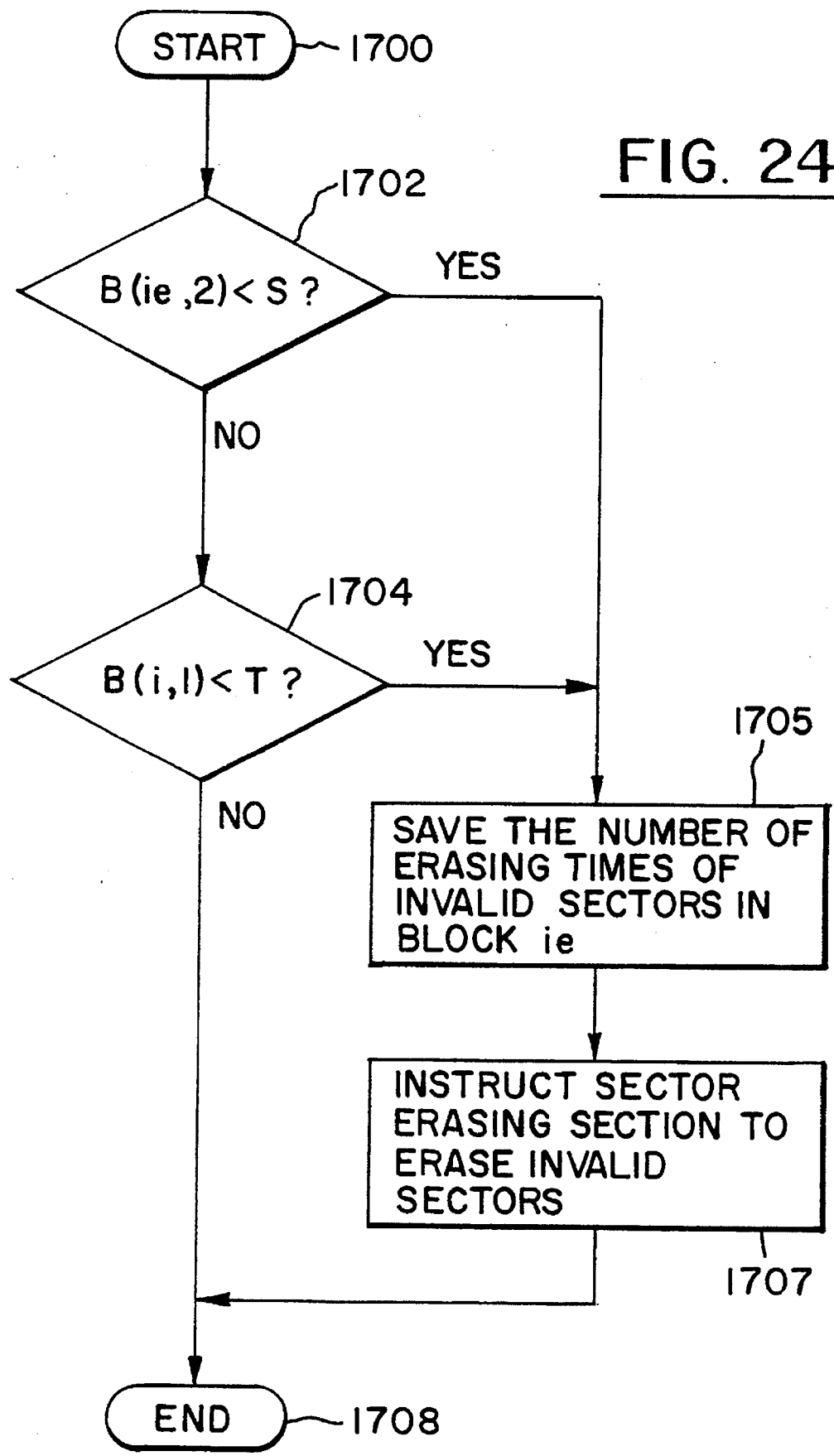
FIG. 24 is a flowchart showing the processings of the sector erase determination and start in FIG. 22.

Further, FIG. 22 shows another embodiment of the present invention which uses a sector erase type flash memory as memory block 32. The sector erase type is a type in which the size of a memory block erased in bulk is equal to the physical size of the file sector. Since the erasing is performed for each sector in this example, the sector saving prior to block erasure is not necessary as compared with the example of FIG. 2, and accordingly there is no sector copying section 42, and instead of block erasing section 43, sector erasing section 82 is formed on a microprocessor to perform the saving and recovery of the number of erasing times of sectors. In addition, sector managing table 60 is provided for each unit of memory block 320, or sector 70. The status and the number of erasing times of sectors are recorded in sector managing table 60, and empty sectors for writing are secured in consideration of the number of erasing times of all the sectors. The normal processing of the command processing section is used to check the buffer, and if there is a command, executes a sector writing or erasing as shown in FIG. 7. However, as shown in FIG. 23, the processing performing a sector copying prior to a sector erasing is unnecessary, and the erasing of invalid sectors is immediately executed (727–733). Further, as shown in FIG. 24, a processing is required to save the number of erasing times of a sector prior to the erasing of the sector and for writing it back (1705–1707).

Figure 25:
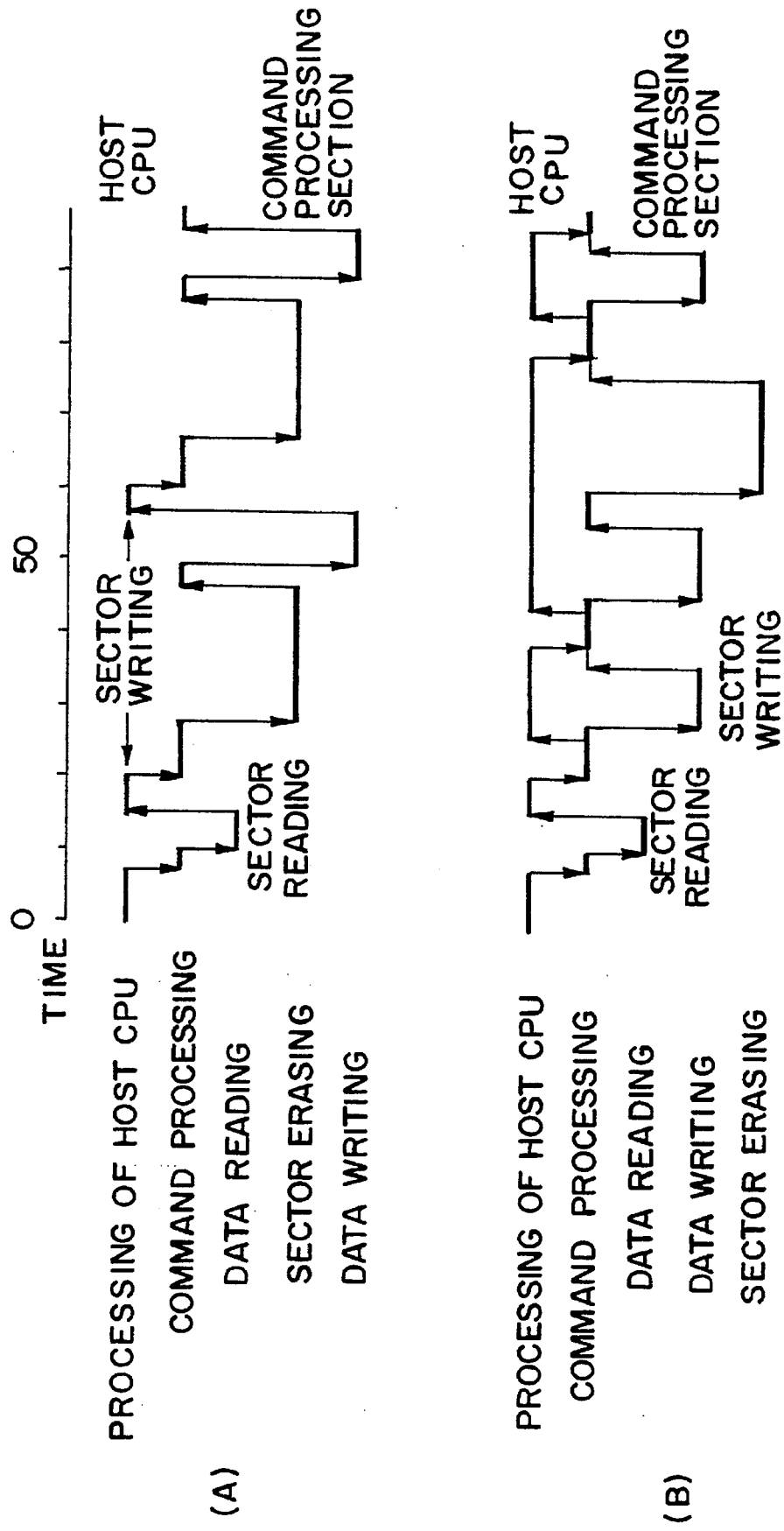
FIG. 25 is a time chart diagram showing the relationship between the normal processing of the command processing section and the interruption processing of the CPU in FIG. 22.

Also in this embodiment, as shown in FIG. 25, all sectors are almost evenly used and high-speed sector writing is enabled. In this example, since the erasing is done on a sector basis, the saving of data and the copying of sectors are not necessary. In the conventional scheme (A), the host CPU also needs to do the erasing of a sector each time the sector is written. In the scheme of the present invention (B), the processing of the host CPU is only used to write a sector and the other processings, for instance, sector erasing is independently processed by the memory controller, and thus the processing time of the host CPU may be short and a high-speed sector writing is made possible.

Incidentally, if the semiconductor has a large capacity, the semiconductor memory may be divided into a plurality of groups each having a plurality of memory blocks, and the above described managing and control of blocks and sectors may be performed for each group.

In accordance with the present invention, a semiconductor external storage system using a flash memory is used which can process data reading and writing at high speed in response to the command of the host CPU. In addition, an external storage system is obtained in which, even if the command of the host CPU frequently rewrites a particular sector of the flash memory, the number of erasing times of sectors are not biased on the actual flash memory and the whole can be effectively utilized. While the invention has been described with respect to a preferred embodiment thereof, it will be understood by those skilled in the art that various changes in detail may be made therein without departing from the spirit, scope, and teaching of the invention. Accordingly, the invention herein disclosed is to be limited only as specified in the following claims

We claim:

1. A method of controlling an external storage system comprising a semiconductor memory as an external storage device, the external storage device further comprising a flash memory having a plurality of memory blocks each memory including at least one sector, and a control section, including a block managing unit for performing control over said memory blocks, and for maintaining a record of the number of times each memory block has been erase and the status of each memory block and sector, the external storage system being connected to a host processor through a bus for transferring data and a command, the method comprising the steps of:

selecting, under control of the control section, a memory block for which data is written or erased on the basis of the record of the block managing unit, converting a logical address included in a command of the host processor to a physical address indicating a corresponding sector in a particular memory block, responding to one of three different commands to perform a process of data writing or reading to the corresponding sector or memory block erasure, sequentially updating the status changes of each sector and memory block resulting from the processes in the block managing means, and recording and updating the relationships between the physical addresses and the logical addresses of the memory block and sector on which the processes were performed in the address conversion means.

2. A method for controlling an external storage system as in claim 1 further comprising the steps of:

accepting a command from the host processor by interruption, and if the command is a data read command, responding thereto to perform the process of reading the data from the corresponding sector of the memory block corresponding to the logical address of the command, and if the command is a write or erase command, holding such command and data in a buffer and executing the write or erase process to the selected memory block or sector when there is no interrupt command from the host processor.

3. A method for controlling an external storage system as in claim 1 further comprising the step of:

selecting, with the control section, a memory block in which data writing or erasing is to be executed on the basis of the record of the block managing unit.

4. A method for controlling an external storage system as in claim 1 further comprising the steps of:

selecting with the control section, based on the record of the block control unit, a memory block having free sectors for copying the data in valid sectors of the memory block to be erased, and copying the data into the selected memory block prior to the erasure of the memory block.

5. A method for controlling a computer system comprising a host processor, a semiconductor memory used as an external storage device, the external memory further comprising a flash memory having a plurality of memory blocks each including at least one sector, and a control section including a block managing unit for performing control over memory blocks, and for maintaining a record of the number of times each memory block has been erased and the status of each memory block and sector, the method comprising the steps of:

converting, under control of the control section the logical address included in the command of the host processor to a physical address indicating the sector in a particular memory block by an address conversion means, selecting a memory block for data writing and a memory block to be erased next to acquire the memory block for data writing, respectively, on the basis of the record of block managing means which has sequentially recorded therein the number of times each memory block was erased and the status of each sector and memory block, writing the data to be written received from the host processor into the memory block for writing, erasing the selected memory block for erasure, and executing a process of data writing, reading or erasing to the memory block or sector that has the physical address obtained from an address conversion table in response to the command.

6. A method as in claim 5, further comprising the step of:

selecting, under control of the control section, a particular memory block of the memory blocks with priority as a memory block to be erased if the number of times the particular memory block was erased is smaller than the largest number of times and other memory block was erased by a predetermined value.

7. A method as in claim 5 further comprising the steps of:

accepting by the control section a command of the host processor by interruption, and if said command is a data read command, reading the data from the corresponding sector of the memory block corresponding to the logical address, and if the command is a write or erase command, holding the command and data in a buffer and executing write or erase processes to the corresponding memory block or sector when there is no interrupt command from the host processor.

8. A method as in claim 5 further comprising the step of:

responding with the control section to a sector write command from the host processor to write the data into a free sector of the selected memory block, and if the logical address of the sector write command is equal to the logical address of the valid sector which has already been written, rewriting only the record of the status with respect to the valid sector of the block managing means to invalid one, and writing the physical address of the free sector into the address conversion means.

9. A method as in claim 5 further comprising the step of:

updating under control of the control section the record of the block managing means on the erasure of the memory block by comparison of the new file allocation information held by the host processor with the old file allocation information held in the external storage system.

10. A method as in claim 5 further comprising the step of:

saving, under control of the control section, a record of the number of times the memory block was erased prior to the erasure of the memory block, and writing the record back to the memory block after the erasure of the memory block.

11. An external storage system connected to a host processor through a host bus for transferring data and at least one command, the storage system comprising:

a semiconductor memory comprising a flash memory having a plurality of memory blocks each including at least one sector, address conversion means for converting a logical address received from the host processor to a physical address corresponding to a particular sector, and block managing means for recording the status of each memory block and sector, and a control section which uses the record of the block managing means to control the reading or writing of data to each sector of the semiconductor memory, or the erasing of a memory block, said address conversion being done on the basis of the record.

12. An external storage system, as in claim 11, wherein the control section further comprises:

a command processing section, a block managing table and an address conversion table formed on the RAM of the main memory, a memory controller including a buffer, and a sector managing table constituting the block managing means along with the block managing table provided on each memory block.

13. An external storage system, as in claim 11, wherein the control section further comprises a data writing section, data reading section and block erasing section for executing a data writing, reading or erasing process to the corresponding memory block or sector of the semiconductor memory on the basis of the command processing section, and a sector copying section for copying the valid sectors of the memory block to be erased to another memory block.

14. An external storage system, as in claim 11, wherein said control section further comprises:

a command processing section, data writing section, data reading section, block erasing section, and a sector copying section used for copying the valid sectors of a memory block to be erased to another memory block which consists of a microprocessor, a block managing table, address conversion table and a buffer which are formed on a RAM, and a sector managing table comprising the block managing means along with the block managing table provided on each memory block.

15. A computer system comprising a host processor, an external storage system including a semiconductor memory which is further comprised of a flash memory having a plurality of memory blocks each including at least one sector, and a host bus for transferring data and a command between the external storage system and the host processor, characterized by:

address conversion means for converting the address from the host processor to the physical address of a particular sector and block managing means for recording the status of each memory block and each sector therein to control the data reading and writing to each sector of the semiconductor memory and the erasure of a memory block in response to the command, said address conversion being done on the basis of the status of each memory block, the control means having means which are responsive to the command from the host processor for executing the process of data writing or reading to the corresponding sector of the semiconductor memory or of erasing a memory block, and for updating the record of the status of each memory block and each sector of the block managing means in connection with such process.

16. A computer system, as in claim 15, further comprising:

interactive display means, connected to the host processor and the external storage system through the host bus, for receiving information from a user.

17. A computer system, as in claim 15, further comprising: display means connected to the host processor and the external storage system through the host bus, wherein the control means outputs to the display means that the semiconducter memory is to be replaced when there is no free sector in any of the memory blocks and there is also no memory block to be erased.

* * * * *